United States Patent
Doyle et al.

(10) Patent No.: US 7,709,544 B2
(45) Date of Patent: May 4, 2010

(54) MICROSTRUCTURE SYNTHESIS BY FLOW LITHOGRAPHY AND POLYMERIZATION

(75) Inventors: Patrick S. Doyle, Boston, MA (US); Daniel C. Pregibon, Cambridge, MA (US); Dhananjay Dendukuri, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 422 days.

(21) Appl. No.: 11/586,197

(22) Filed: Oct. 25, 2006

(65) Prior Publication Data

US 2007/0105972 A1  May 10, 2007

Related U.S. Application Data

(60) Provisional application No. 60/730,052, filed on Oct. 25, 2005.

(51) Int. Cl.
C08F 2/46 (2006.01)
C08F 2/48 (2006.01)
C08F 2/50 (2006.01)

(52) U.S. Cl. ............... 522/3; 522/1; 522/2; 522/6; 522/33; 522/71; 264/401; 264/405; 264/463; 264/462; 264/482; 264/494; 523/300; 523/313; 524/17; 524/21

(58) Field of Classification Search ............... 264/401, 264/405, 482, 492, 494; 522/1, 3, 903, 6
See application file for complete search history.

(56) References Cited

U.S. PATENT DOCUMENTS

| 4,929,400 | A | 5/1990 | Rembaum | |
|---|---|---|---|---|
| 2002/0056945 | A1* | 5/2002 | Gelbart | 264/401 |
| 2003/0045597 | A1* | 3/2003 | Randolph et al. | 522/74 |
| 2005/0043428 | A1 | 2/2005 | Caneba | |
| 2005/0172476 | A1 | 8/2005 | Stone | |
| 2005/0196702 | A1* | 9/2005 | Bryant et al. | 430/311 |
| 2005/0214737 | A1 | 9/2005 | Dejneka | |

FOREIGN PATENT DOCUMENTS

| GB | 2388652 A * | 11/2003 |
|---|---|---|
| JP | 54 074886 | 6/1979 |
| WO | WO 00/74927 | 12/2000 |
| WO | WO 2004/076056 | 9/2004 |

(Continued)

OTHER PUBLICATIONS

Beebe et al. Functional Hydrogel Structures For Autonomous FLow Control inside Microfluidic Channels (Nature, 2000, 404, p. 588-590).*

(Continued)

Primary Examiner—Randy Gulakowski
Assistant Examiner—Rachel Kahn
(74) Attorney, Agent, or Firm—Theresa A. Lober

(57) ABSTRACT

In a method for synthesizing polymeric microstructures, a monomer stream is flowed, at a selected flow rate, through a fluidic channel. At least one shaped pulse of illumination is projected to the monomer stream, defining in the monomer stream a shape of at least one microstructure corresponding to the illumination pulse shape while polymerizing that microstructure shape in the monomer stream by the illumination pulse.

133 Claims, 12 Drawing Sheets

FOREIGN PATENT DOCUMENTS

WO   WO 2005/103106   11/2005

OTHER PUBLICATIONS

Kenis et al. Microfabrication inside capillaries using multiphase laminar flow patterning. (Science, 1999, 285, p. 83-85).*
Perro et al. Design and synthesis of Janus micro- and nanoparticles (Journal of Materials Chemistry, Jul. 2005, 15, p. 3745-3760).*
Ciba Formulators Guide for Coatings—Photoinitiators for UV Curing. Ciba Specialty Chemicals. Available on the web Sep. 2003 at http://www.mufong.com.tw/Ciba/ciba_guid/photo_uv_2.pdf.*
PCT International Search Report, PCT/US2006/041668.
PCT Written Opinion of the International Searching Authority, PCT/US2006/041668.
Sugiura et al., "Preparation of Monodispersed Polymeric Microspheres over 50 micron Employing Microchannel Emulsification," Ind. Eng. Chem. Res., V. 41, pp. 4043-4047, Jul. 2002.
Roh et al., "Biphasic Janus particles with nanoscale anisotopy," nature materials, V. 4, pp. 759-763, Oct. 2005.
Kim et al., "Hydrodynamic fabrication of polymeric barcoded strips as components for parallel bio-analysis and programmable microactuation," Lab Chip., V. 5, pp. 1168-1172, 2005.
Fialkowski et al., "Self-assembly of polymeric microspheres of complex internal structures," nature materials, V. 4, pp. 93-97, Jan. 2005.
Millman et al., "Anisotropic particle synthesis in dielectrophoretically controlled microdroplet reactors," nature materials, V. 4, pp. 98-102, Jan. 2005.
Dendukuri et al., "Controlled Synthesis of Nonspherical Microparticles Using Microfluidics," Langmuir, V. 21, pp. 2113-2116, Feb. 2005.
Rolland et al., "Direct Fabrication and Harvesting of Monodisperse, Shape-Specific Nanobiomaterials," J. Am. Chem. Soc., V. 127, pp. 10096-10100, 2005.
Dendukuri et al., Continuous-flow lithography for high-throughbput microparticle synthesis, nature materials, V. 5, pp. 365-369, May 2006.
Research Highlights, nature, V. 440, p. 848, Apr. 2006.
Research Highlights, Lab Chip, V. 6, pp. 707-709, 2006.
Nisisako et al., "Synthesis of Monodisperse Bicolored Janus Particles with Electrical Anisotropy Using a Microluidic Co-Flow System," Adv. Mater., V 18, pp. 1152-1156, 2006.
Mukhoadhyay, "Microparticles of all shapes and chemistries," Analysical Chemistry, p. 4247, Jul. 1, 2006.
Jo et al., Three-Dimensional Micro-Channel Fabrication in Polydimethylsiloxane (PDMS) Elastomer, Jnl. of Microelectromechanical Systems, V. 9, N. 1, pp. 76-81, Mar. 2000.
Hillborg et al., "Crosslinked polydimethylsiloxane exposed to oxygen plasma studied by neutron reflectometry and other surface specific techniques," Polymer, V. 41, N. 18, p. 6851-6863, May 2000.
Shiku et al., "Oxygen Permeability of Surface-modified Poly(dimethylsiloxane) Characterized by Scanning Electrochemical Microscopy," Chemistry Letts., V. 35, N. 2, pp. 234-235, 2006.

* cited by examiner

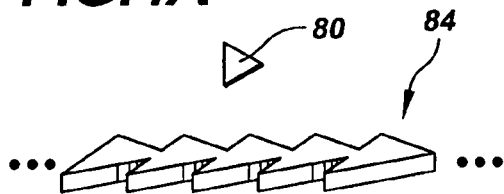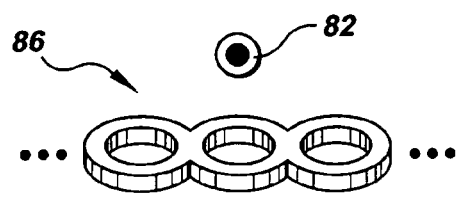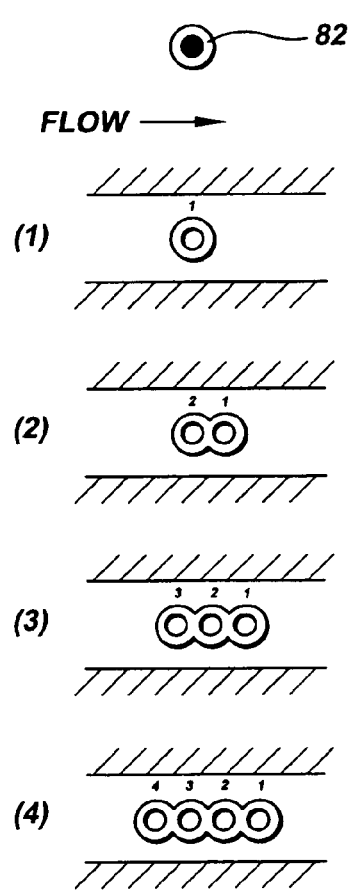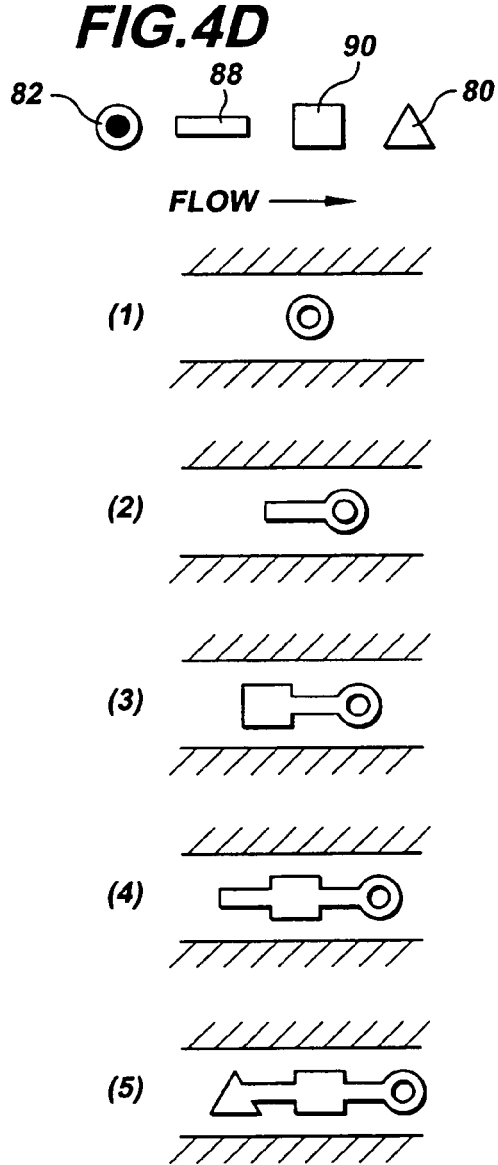

MICROSTRUCTURE SYNTHESIS BY FLOW LITHOGRAPHY AND POLYMERIZATION

CROSS-REFERENCE TO RELATED APPLICATIONS

This application claims the benefit of U.S. Provisional Application No. 60/730,052, filed Oct. 25, 2005, the entirety of which is hereby incorporated by reference.

STATEMENT REGARDING FEDERALLY SPONSORED RESEARCH

This invention was made with Government support under Contract No. CTS-0304128 awarded by NSF. The Government has certain rights in the invention.

BACKGROUND OF INVENTION

This invention relates generally to polymer materials, and more particularly relates to techniques for synthesizing polymeric microstructures.

Polymeric microstructures are important for a wide range of applications, including MEMS, biomaterials, drug delivery, self-assembly, and other applications. The ability to controllably synthesize such microstructures, herein defined as structures having features in the size range of about 10 nm to about 1000 µm, is increasingly significant for enabling applications such as paints, rheological fluids, catalysis, diagnostics, and photonic materials. Monodisperse polymeric microstructures, herein defined as having a microstructure size distribution where >90% of the distribution lies within 5% of the median microstructure size, are particularly desirable as they can exhibit a constant and predictable response to external fields and can self-assemble in a predictable manner.

Conventionally, polymer microstructure synthesis is carried out by a batch process such as photolithography, stamping, or emulsion polymerization, or by an emulsion-based microfluidic technique such as flow-through microfluidic synthesis. Although these techniques have provided significant advances in microstructure synthesis, it is found in general that each limits microstructure composition and/or geometry. For example, photolithographic techniques generally limit the microstructure material to that which is compatible with a photolithographic process, e.g., requiring a photoresist as the structural material. Historically, the synthesis of polymeric microstructures with microfluidics has focused almost exclusively on spheroidal microstructures, in part because the minimization of microstructure interfacial energy leads to the formation of spheres or deformations of spheres such as rods, ellipsoids or discs, or cylinders.

In addition to these limitations in polymeric microstructure composition and geometry, conventional polymeric microstructure synthesis generally requires isotropic structural arrangements of materials. Further, the through-put of such processes is typically limited by a requirement for making one structure at a time or a limited photo-mask-defined field of structures at a time. These limitations in polymeric microstructure synthesis through-put, microstructure geometry, morphology, and functionality have restricted the ability to address the growing number of critical applications for which polymeric microstructures could be well suited.

SUMMARY OF THE INVENTION

The invention overcomes the limitations of conventional polymeric microstructure synthesis to provide lithographic-based microfluidic microstructure synthesis techniques that can continuously synthesize polymeric microstructures of varied complex shapes and chemistries. In one example polymeric microstructure synthesis method of the invention, a monomer stream is flowed at a selected flow rate through a fluidic channel; and at least one shaped pulse of illumination is projected to the monomer stream. This illumination projection defines in the monomer stream a shape of at least one microstructure corresponding to the illumination pulse shape while polymerizing that microstructure shape in the monomer stream by the illumination pulse.

In a further example synthesis process provided by the invention, a monomer stream is flowed at a selected flow rate, through a fluidic channel and illumination is projected to the monomer stream to polymerize at least one microstructure in the monomer stream by the illumination. At least one polymerization termination species is provided, at internal walls of the fluidic channel, which terminates at the channel walls active polymerization sites at which polymerization could occur during polymerization of the microstructure. This quenches polymerization at those sites and preserves a non-polymerized volume of the monomer stream adjacent to the channel walls.

This high-throughput technique enables superior control over microstructure geometry, shape, composition, and anisotropy. Non-spheroidal polymeric microstructures each having a plurality of distinct material regions can be synthesized by the technique, as can planar polymeric microstructures each having a plurality of distinct material regions. Other features and advantages of the invention will be apparent from the following description and accompanying figures, and from the claims.

BRIEF DESCRIPTION OF THE DRAWINGS

FIGS. 4A-4B are schematic views of example chain-like polymeric microstructures and the corresponding lithographic mask employed to produce each microstructure, in accordance with the invention;

FIGS. 4C-4D are schematic views of sequential lithography-polymerization steps in the synthesis of chain-like polymeric microstructures, and the corresponding lithographic mask employed to produce each microstructure, in accordance with the invention;

DETAILED DESCRIPTION OF THE INVENTION

Figure 1A:
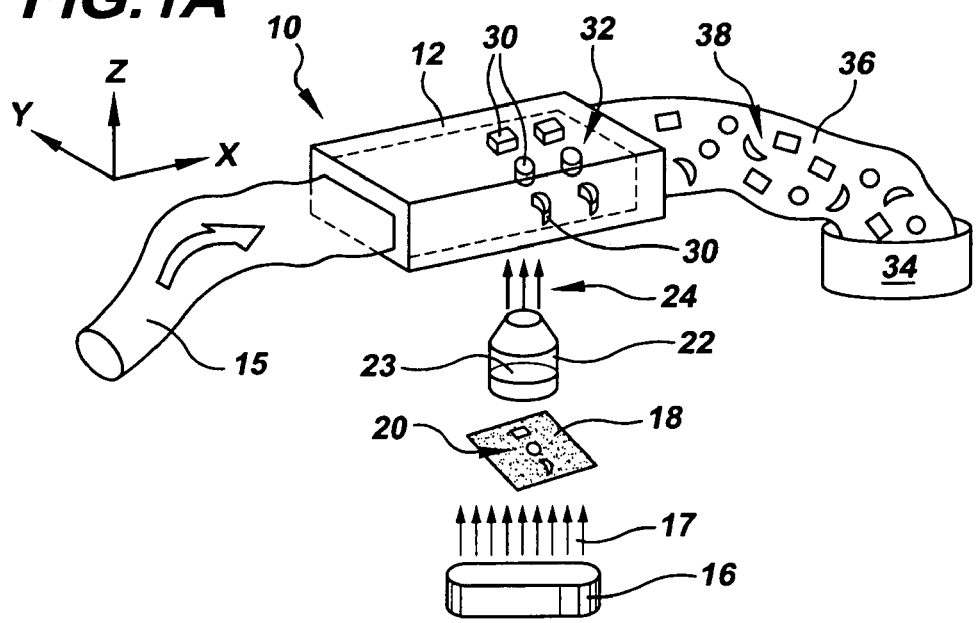
FIG. 1A is a schematic view of an example polymeric microstructure synthesis system in accordance with the invention.

Referring to FIG. 1A there is shown a schematic view of an example polymeric microstructure synthesis system 10 in accordance with the invention. The system 10 includes a microfluidic device 12 having a selected hollow cross-sectional geometry. The example microfluidic device of FIG. 1A exhibits a rectangular channel-like cross section but a wide range of other cross section geometries can be employed as described below. In one example implementation, the microfluidic device channel width is characterized by an inner channel width of, e.g., between about 100 nm and about 1 mm, with channel walls having a thickness of, e.g., between about 100 μm and 1 cm, and with a channel length of, e.g., between about 1 mm and several centimeters. The microfluidic device is configured to accept a monomer stream 15 that is directed to the hollow cross section, or channel, of the microfluidic device for passage through the device. The microfluidic device is formed of any suitable material, as explained below. In the example arrangement of FIG. 1A the microfluidic device can be constructed of, e.g., polydimethylsiloxane (PDMS) or other suitable material.

The monomer stream 15 can include a range of constituents, as explained in detail below. At least one of the constituents is provided as a liquid-phase monomer that can be polymerized by a selected polymerization process, e.g., photo-polymerization, thermal polymerization, or other process. In the example system of FIG. 1A the monomer stream includes a photo-polymerizable monomer and a photosensitive initiator species. One example of a suitable photo-polymerizable monomer is poly(ethylene glycol) diacrylate (PEG-DA), e.g., having a molecular weight of 400, with 2-hydroxy-2-methyl-1-phenyl-propan-1-one employed as the photosensitive initiator species. The monomer stream can also include other selected monomers, as well as particles, molecules, porogens, and other species as explained below. Whatever its composition, the monomer stream includes at least one liquid-phase polymerizable monomer that enables passage of the stream through the microfluidic device 12.

At one or more points along the microfluidic device is provided stimulation for enabling the formation and polymerization of microstructures in the monomer stream. For the example of FIG. 1A in which the monomer stream includes a photo-polymerizable monomer, at one or more selected points along the length of the microfluidic device there is provided a source 16 of illumination 17 that is directed toward the microfluidic device 12. The walls of the microfluidic device are preferably substantially transparent to the wavelength of the illumination 17. Visible light, UV light, IR light, or other wavelength of light can be employed as-suited for a selected monomer species, as explained in detail below. For the PEG-DA monomer described above, UV illumination is a suitable polymerizing radiation.

The polymerizing radiation is shaped in correspondence with desired polymeric microstructure shapes. For example, interposed between the illumination source and the microfluidic device can be provided one or more lithographic masks or other lithographic system for shaping the illumination. In the example of FIG. 1A, there is provided a dark field lithographic mask 18 including one or more shapes 20 desired for polymeric microstructures to be synthesized. As shown in FIG. 1A the mask can include a plurality of distinct shapes or can include a number of replications of a single shape.

A lens system 22 can be interposed between the lithographic mask and the microfluidic device if desired for controlling magnification, focus, or other aspect of the illumination 17 directed through the mask. The illumination exits the lens system and is directed to the microfluidic device. In accordance with the invention, the illumination is temporally controlled to provide pulses of illumination of a selected duration. A shutter 23 or other mechanism for controlling the duration of illumination is preferably provided in a suitable configuration with the lens system 22 and illumination source 16. The duration of each illumination pulse is set based on the flow rate of the monomer stream, the polymerizing characteristics of the monomers in the stream, and the desired shape of a microstructure. As explained in detail below, the flow rate of the monomer stream is also controlled, and can be stopped, in coordination with the temporal control of the illumination. The illumination pulses can be provided as a sequence of pulses, each of a selected duration, or as a single long-duration pulse, as-prescribed for a given application.

Figure 1B:
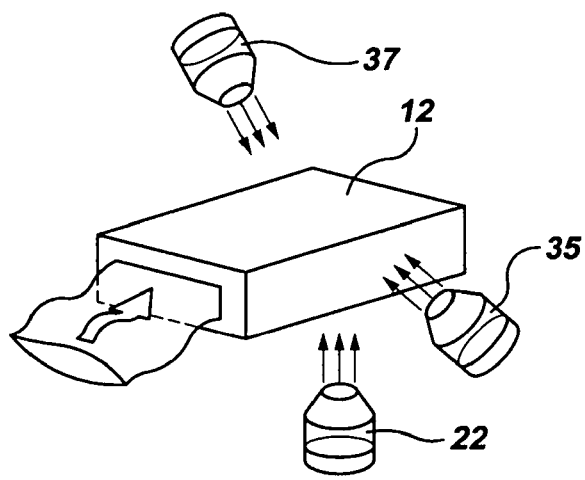
FIG. 1B is a schematic view of the microstructure synthesis system of FIG. 1A configured with multiple sources of illumination in accordance with the invention.

Referring also to FIG. 1B, there can be provided multiple illumination sources and lens systems 22, 35, 37, along the length of the microfluidic device and/or at locations around selected walls of the device, for delivering pulses of illumination to a monomer stream from different angles and locations around the microfluidic device. For clarity in FIG. 1B there are shown lens systems 22, 35, 37, but such are intended to represent the inclusion of shuttering systems, illumination sources, and illumination masks or other shaping devices in conjunction with the lens systems as in the manner of FIG. 1A and described just above.

Referring now back to FIG. 1A, exposure of the monomer stream 15 passing through the microfluidic device 12 to a pulse of the shaped illumination 24 polymerizes mask-defined microstructure shapes 30 directly in the monomer stream. The illumination exposure simultaneously defines the shapes of polymeric microstructures and polymerizes the shaped microstructures. This dual lithography-polymerization action occurs in the continuous phase of the monomer stream; that is, the one or more liquid-phase polymerizable monomers in the stream operate as a continuous phase of the stream and are themselves polymerized. Thus the polymerized microstructures resulting from the dual lithography-polymerization action include polymeric material from the continuous phase of the monomer stream.

As stated above, flow of the monomer stream can be controlled in a coordinated manner with the illumination exposure to in turn control characteristics of the microstructure polymerization. The flow rate and exposure duration are preferably together selected such that there is sufficient dwell time of a given volume of the monomer stream at the site of illumination exposure for substantially full polymerization of mask-defined microstructures in the stream. If desired, the monomer stream flow can be substantially stopped in coordination with illumination pulse exposure. With continuous monomer stream flow, a high synthesis through-put, e.g., 100 microstructures per second, can be achieved. Such can further be enhanced with the inclusion of multiple illumination points along the length of the microfluidic device, in the manner described above, and by increasing the illumination area and the corresponding number of microstructure shapes projected to the increased area.

As shown in FIG. 1A, once polymeric microstructures 30 are polymerized in the monomer stream, the polymerized microstructures advect through un-polymerized monomer of the stream through the microfluidic device. A set 32 of such polymerized structures are schematically shown in FIG. 1A downstream of the lithography-polymerization point. The volume of un-polymerized continuous-phase monomer remaining in the stream after the lithography-polymerization step operates to conduct the polymerized microstructures through and out of the microfluidic device. A reservoir 34 is provided for collecting the output monomer stream 36, which includes a population 38 of polymerized microstructures. As can be recognized, if only one transparent mask shape is employed, then the microstructure population is homogeneous, and preferably is monodisperse.

The synthesized microstructures can be rinsed in the reservoir or, e.g., pipetted into another container for rinsing. For example, the monomer stream including the microstructure population can be pipetted from the reservoir into an eppendorf tube, suspended in a buffer with a surfactant to prohibit agglomeration, and centrifuged to retrieve the microstructure population from the monomer stream. The microstructure population can then be employed for a selected application.

The ability of the monomer stream to conduct the polymerized microstructures through and out of the microfluidic device is enabled in accordance with the invention by preserving a non-polymerized volume of the stream at the location of the walls of the microfluidic device as well by the unpolymerized stream volume between microstructures, at locations that were masked from the polymerizing illumination. Preservation of a non-polymerized volume of the stream at the location of the device walls prohibits polymerization from extending to the walls of the device and inhibits adhesion of polymerized microstructures to the device walls. In general, in accordance with the invention, this is achieved by providing at the internal faces of the microfluidic device walls a species that can participate in a polymerization termination step; i.e., a species that can react to terminate active polymerization sites at which polymerization could occur, such that polymerization is quenched at those sites near to the device walls.

The selected polymerization termination species can be provided at the internal walls of the microfluidic device in any convenient manner suited for a given application. For example, the polymerization termination species can be directed to pass through the hollow cross-sectional channel of the microfluidic device at the walls of the device, as described in more detail below. Alternatively, the polymerization termination species can be provided by diffusion of the species through the microfluidic device walls from the ambient to the internal wall faces. For many applications, this arrangement can be particularly convenient and elegantly simple to implement; all that is required is that the microfluidic device be provided as a material that is sufficiently porous to enable diffusion of the selected termination species while sufficiently solid to contain the monomer stream in the device.

In one example of polymerization termination species diffusion through the microfluidic device walls, the termination species is specified as ambient oxygen and the monomer to be polymerized is specified as a free-radical-polymerization monomer, e.g., the PEG-DA monomer described above, with the 2-hydroxy-2-methyl-1-phenyl-propan-1-one photoinitiator described above. The microfluidic device is here formed of PDMS, as described above, which is porous to oxygen, or is formed of another suitable oxygen-permeable material, such as Mylar, polyurethane, polyethelene, polychlorophene, mercapto ester-based resins, e.g., Norland 60, from Norland Optical Products, Inc., New Brunswick, N.J., porous Tygon® tubing from Saint-Gobain Performance Plastics, Mickleton, N.J., or other material.

When a PEG-DA-based monomer stream passing through the PDMS device is exposed to a pulse of UV illumination, the 2-hydroxy-2-methyl-1-phenyl-propan-1-one photoinitiator forms free radicals, some of which are passed to the PEG-DA monomer for initiating polymerization of the PEG-DA monomer. Oxygen diffusing through the PDMS walls of the microfluidic device reacts with these free radicals to terminate the molecular free-radical sites, both on the initiator species and on the monomer. The free-radical sites are thereby converted to chain-terminating peroxide radicals. Polymer chain growth is then inhibited, or quenched, at the converted sites.

Near to the internal faces of the PDMS device walls, this polymerization termination process continues as oxygen is consumed in the chain-terminating conversion of free-radical sites in the monomer stream near to the device walls, causing more oxygen to diffuse through the device walls. This results in the formation of a thin un-crosslinked, non-polymerized lubricating monomer layer at the microfluidic device walls. The lubricating monomer layer provides a volume of continuous-phase monomer stream through which polymerized microstructures can advect and prohibits adhesion of the microstructures to the device walls.

With this oxygen-aided polymerization inhibition technique, the invention provides a discovery that free-radical polymerization termination, which is typically considered to be a hindrance for most applications, can be exploited and controllably enforced to enable polymerization directly in a continuous phase monomer stream with polymerization inhibited at edges of the monomer stream and non-polymerized monomer preserved for transporting polymerized microstructures dispersed in the monomer steam. The example oxygen-based termination process is applicable to any free-radical polymerization system. For example, monomers such as 1,1,1-tri(methyl propane triacrylate), 1,6-hexanediol diacrylate, and poly(ethylene glycol) dimethacrylate, among others, as identified in detail below, can be employed, with photoinitiators such as DMPA or IRGACURE 184 (1-Hydroxy-cyclohexyl-phenyl-ketone), from Ciba Specialty Chemicals, Tarrytown, N.Y.

The thickness of the non-polymerized lubricating monomer layer at the microfluidic device walls is set by the concentration of species in the monomer stream for which free radicals are generated by the lithographic illumination, by the local intensity of the illumination, and by the degree of terminating species, e.g., oxygen flux, through the device walls. In addition, it is to be recognized that each polymerization chemistry is characterized by distinctive reaction kinetics that adjust free radical concentration in a monomer stream. Thus, for many applications, empirical analysis can be preferred to determine process parameters that provide a sufficient lubricating monomer layer. For many applications, a lubricating layer thickness of between about 1 µm and about 5 µm is sufficient to prohibit microstructure adhesion to walls as the microstructures are carried out of the microfluidic device.

The polymerization termination process of the invention can be implemented with a range of polymer chemistries and terminating species. For example, free-radical terminating species such as HQ (hydroquinone) or MEHQ (monomethyl ether hydroquinone) and suitably permeable device materials can be used to terminate free-radical species in the microstructure polymerization process. In addition, a range of free-radical polymerization-initiating species can be employed in a polymerization that is not necessarily photo-initiated. For example, thermally-activated free-radical initiators, e.g. 2,2'-Azobis(2-methylpropionitrile), can be used with an appropriate heat source, e.g. laser illumination or patterned conducting electrodes, to create free-radicals for free-radical-based polymerization; oxygen or other terminating species being employed to prohibit polymerization at the microfluidic device walls.

The process is further not limited to free-radical termination. For example, given the photoresist SU-8, which is based on EPON SU-8 epoxy from Shell Chemical, NY, N.Y., as a polymerizing species in the monomer stream, termination of SU-8 polymerization at the microfluidic device sidewalls can be implemented with a selected base species, such as 3-ethylamine, 3-octylamine, or other suitable base that quenches SU-8 polymerization. The selected base species can be provided to the monomer stream at internal faces of the microfluidic device sidewalls by diffusion through the sidewalls, given a suitable porosity in the sidewalls. For example, a device of PDMS or other suitable porous material can be employed for diffusing a liquid base or other liquid species through the device. Here the device can be initially saturated with the selected liquid species, with the liquid continuously supplied to the outer surface of the device, e.g., in a bath arrangement, to replenish the liquid as it is consumed within the microfluidic device.

Given an arrangement in which a terminating species is supplied to internal faces of the microfluidic device walls by diffusion through the walls, the material of the microfluidic device is preferably sufficiently permeable to the terminating species of interest. For example, for the terminating species oxygen, the device walls preferably have an $O_2$ gas permeability of at least about 10 barrer. For the terminating species of a selected liquid, the device walls preferably have a liquid permeability of about 10 barrer.

The microfluidic device can be polymeric, as in the example materials described above, or can be non-polymeric. For example, glass microfluidic device walls, with suitable nano-scale holes for permeability of a selected terminating species, can be employed. Microfluidic device walls can also be provided as, e.g., track-etched membranes, and other structures, including, e.g., porous silica substrates or other inorganic structures, such as glass slides. It is not required that all walls be permeable, but it is preferred that those walls exposed to a polymerizing agent, such as illumination, be permeable to a selected terminating species for enabling termination of polymerization at those walls. Of course, as explained above, the one or more walls through which illumination is directed to a monomer stream are preferably substantially transparent to the illumination wavelength, and illumination can be directed through multiple device walls for inducing polymerization termination at those walls.

In accordance with the invention, a terminating species can also be introduced into the monomer stream flow channel along with the monomer stream instead of diffusing into the channel through the microfluidic device walls. In one example arrangement of such, an annular sheath flow of fluid containing a selected terminating species is provided at the microfluidic device channel inlet to enclose an inner cylindrical flow of the monomer stream. In another example arrangement, two fluids with different wetting properties are introduced at a Y-junction input to the channel, in a manner discussed in more detail below, such that the fluids flow parallel to each other. Process conditions can here be tuned such that the fluid containing the terminating species preferentially wets the surface walls of the device, leading to an enveloping of the monomer stream species to be polymerized.

Figure 2:
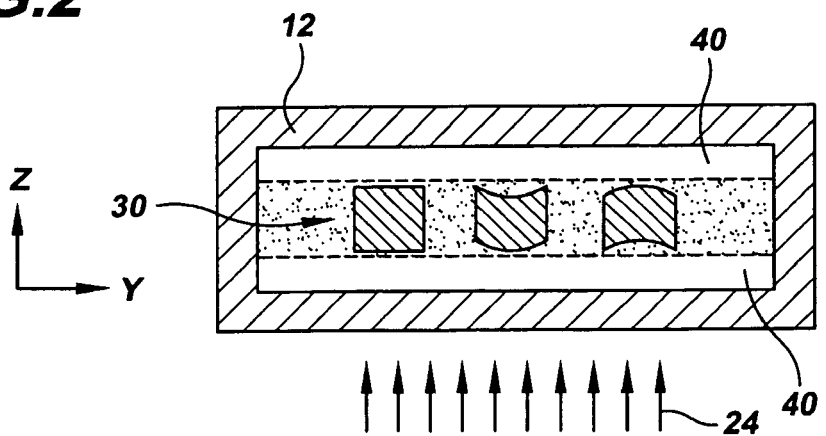
FIG. 2 is a schematic cross-sectional view of three polymeric microstructures as-synthesized in the microstructure synthesis system of FIG. 1.

Referring now also to FIG. 2, which is a cross-sectional view of the microfluidic device 12 in FIG. 1A taken at the point along the device in which shaped illumination 24 is projected to the device, the shapes of the polymerized microstructures 30 in the x-y plane, defined in FIG. 1A, are determined by the shapes of the features 20 included on the transparency mask 18. The z-plane projection of the microstructures is dependent on the height of the microfluidic device cross-section and the thickness of the polymerization inhibition layers 40 produced at those walls that are exposed to the illumination. The polymerization inhibition layer thickness is independent of device height, and thus has a more-pronounced effect on microstructures synthesized in low-height devices, where the layer occupies a larger fraction of the device height.

Figure 3A:
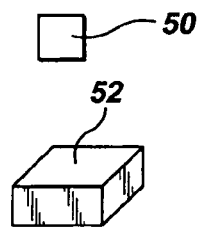
FIGS. 3A-3P are schematic views of example polymeric microstructures and the corresponding lithographic mask employed to produce each microstructure, in accordance with the invention.
Figure 3B:
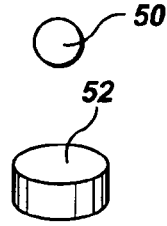
Figure 3C:
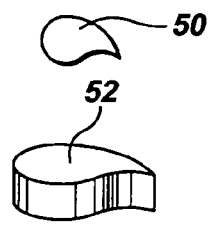
Figure 3D:
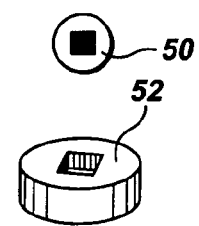
Figure 3E:
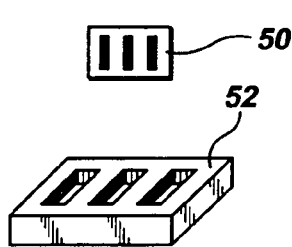
Figure 3F:
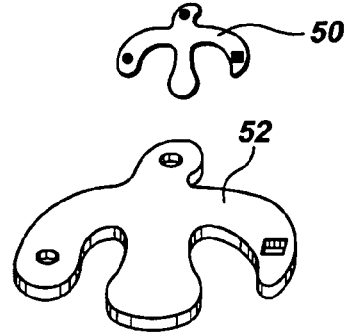
Figure 3G:
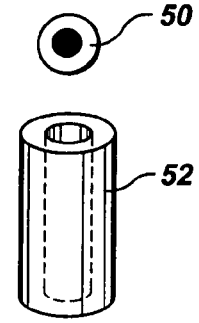
Figure 3H:
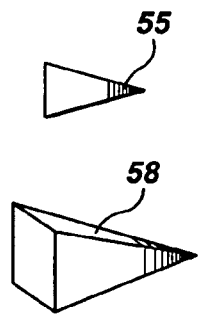
Figure 3I:
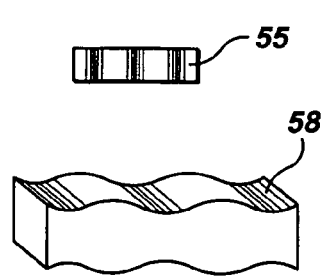
Figure 3J:
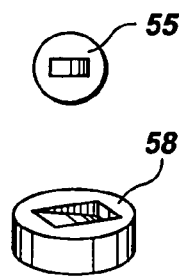

FIGS. 3A-3G present a range of example polymeric microstructure configurations that are enabled by the invention with a synthesis system like that of FIG. 1. Each of FIGS. 3A-3G schematically represent an example shape 50 of a transparency mask and the corresponding polymeric microstructure 52 produced by the synthesis process described above. As shown in these figures, curved, straight-edged, hollow geometries, in a nearly arbitrary combination, can be produced. Many of the microstructures can be characterized as planar microstructures in that their extent in a selected plane, e.g., the x-y plane, is substantially larger than that in the z-plane. Referring also to FIGS. 3H-3J, if the shape is produced with a gray-scale mask configuration 55, where gray-scale features of a shape are provided on the mask, then corresponding shaped-profile microstructures 58 result from the microstructure synthesis process of the invention, with tailoring of the microstructure profile in the z-plane.

Figure 3K:
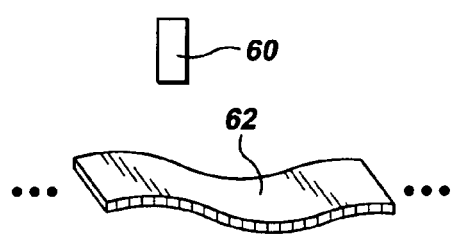

Referring now to FIGS. 3K, 3L, 3M, and 3N, ribbon-like structures can also be produced by the lithography-polymerization step. As shown in FIG. 3K, a selected mask 60 is employed to set the width and other features of the ribbon microstructure 62. The mask can be, e.g., rectangular, square, round, or other geometry to set the width characteristic of the extruded ribbon structure. In formation of such a ribbon-like structure, the projection of illumination is not pulsed in the manner described above, and instead is continuously maintained on as the structure is lithographically defined and polymerized and then transported through the microfluidic device.

Figure 3L:
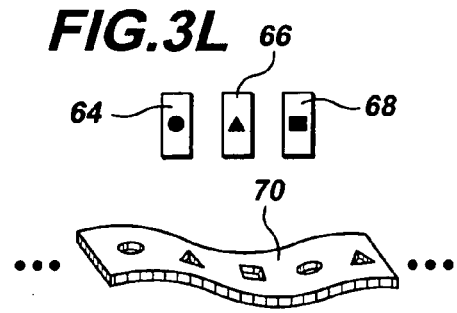

As shown in FIG. 3L, a dynamic mask technique can be employed to impose changeable mask shapes on a polymerizing ribbon microstructure as the microstructure is extruded through the fluidic microdevice. As explained in detail below, such a dynamic mask technique can be implemented by, e.g., a digital micromirror device (DMD) or other suitable device that enables changes in mask features while continuous illumination is maintained during the lithography-polymerization process. In the example of FIG. 3L, three changing mask shapes 64, 66, 68 are employed to produce a ribbon structure 70 having a sequence of distinct shapes along the length of the ribbon. This technique enables wide flexibility in customization of ribbon microstructure features.

Figure 3M:
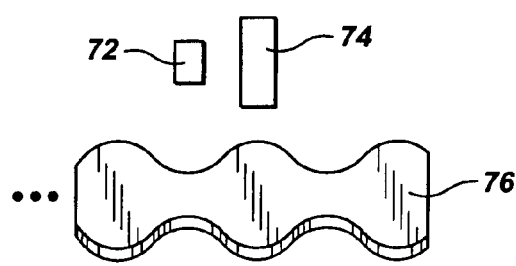

As shown in FIG. 3M, features of the ribbon structure profile can also be adjusted by a dynamic mask technique as the ribbon is polymerized. For example, given two rectangles 72, 74 of differing length, a ribbon structure 76 having a modulating width can be produced by alternating exposure of a continuously-flowing monomer stream between the two mask geometries. Similarly, as shown in FIG. 3N, with a single rectangle 72 and two rectangles 74 employed as two distinct mask features, a ribbon structure 78 can be produced having both modulation in the ribbon width as well as changes in features along the ribbon.

Figure 3O:
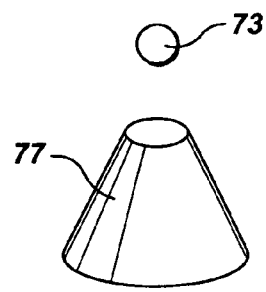
Figure 3N:
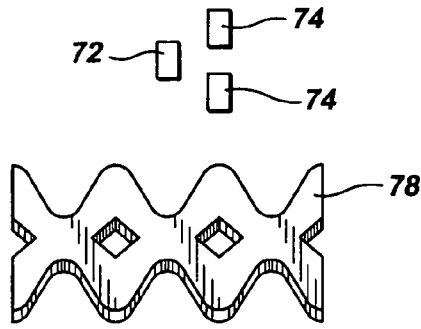
Figure 3P:
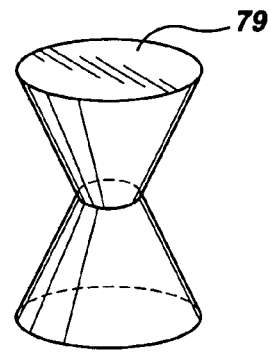

Referring to FIGS. 3O-3P, there can be produced polymeric microstructures 77, 79 having conical profiles that result from conditions of illumination that are controlled in combination with the microstructure mask shape. As shown in FIG. 3O, a circular mask shape 73 is here employed. This circular mask shape can produce the structures of FIGS. 3O-3P when the microfluidic device channel is sufficiently tall that points in the channel are out of the depth of field of illumination that is focused on the channel. If the illumination is focused on the center of the channel and the depth of field is smaller than the height of the channel, then the double-conical microstructure of FIG. 3P is synthesized. If the illumination is focused at a non-center point of the channel and the depth of field is smaller than the height of the channel, then the conical microstructure of FIG. 3O is synthesized, with the extent of each conical structure is determined by the location of the focus relative to the channel height.

Now referring to FIGS. 4A-4B, if the monomer stream flow rate and illumination pulse duty cycle are controlled to cause polymerization at directly adjacent or slightly overlapping volumes of the monomer stream, then a mask feature 80, 82 can be employed to form chain-like microstructures 84, 86, respectively, where each chain is formed as a sequence of connected polymeric shapes.

FIG. 4C schematically represents an example sequence of lithography-polymerization events employed for producing the chain structure 86 of FIG. 4B. With the monomer stream flow from left to right as indicated in the figure, pulses of illumination are repeated as the monomer stream continuously flows such that each polymeric shape is appended to the growing chain-like structure, with each additional polymeric shape linked by an overlapping polymerized region. For example, at a first illumination pulse (1), a first cylindrical structure is formed; at a second pulse (2) a second cylindrical structure is appended to the first; then at a third pulse (3) a third cylindrical structure is appended to the second; and at a fourth pulse (4) a fourth cylindrical structure is appended to the third. In this manner the chain-like structure can be extended to a desired length.

FIG. 4D schematically represents an example sequence of lithography-polymerization events employed for producing a chain-like structure with a dynamic mask technique that enables adjustment or change of the microstructure shape being appended to a chain-like microstructure. Again with the monomer stream flow from left to right as indicated in the figure, pulses of illumination are repeated as the monomer stream continuously flows such that each shape unit is appended to the growing chain-like structure, with each shape unit linked by an overlapping polymerized region. At a first illumination pulse (1), a first cylindrical structure is formed; at a second pulse (2) a rectangular structure is appended to the cylinder; at a third pulse (3) a square structure is appended to the rectangle; at a fourth pulse (4) a rectangle is appended to the square; and at a fifth pulse (5) a triangle is appended to the rectangle. This dynamic mask changing enables a high degree of customization of a chain-like structure and can produce a near-arbitrary range of chain combinations.

The shapes and feature geometries of FIGS. 3-4 are representative of the polymeric microstructures that can be produced in accordance with the invention, but are not exhaustive. These examples demonstrate that both discrete, particle-like microstructures, as well as interconnected microstructures, such as ribbons or chains, can be produced by the microstructure synthesis process of the invention. The microstructures can non-continuous across a plane of the microstructure, as in the example microstructures of FIGS. 3D-3F. Additional microstructure geometries can include, e.g., polygonal features, such as hexagons, colloidal cuboid microstructures, high-aspect-ratio objects such as posts with circular, triangular, or square cross sections, and non-symmetric objects. The term "microstructure" is herein meant to refer to any structure having feature sizes on the length scale of about 10 nm to about 1000 µm. No particular geometry or symmetry is implied by the term. But circular, rounded, symmetric and other such geometries can be produced in accordance with the invention. For many applications, the term "microparticle" can also be employed to describe microstructures that are distinct, separate entities which can be dispersed in a continuous phase. The ribbon and chain-like microstructures descried above are not for most applications characterized as microparticles, but are microstructures as contemplated by the invention.

The correspondence between a mask shape and a resulting microstructure geometry is in part based on the lens system employed to implement the projection lithography of the single-step lithography-polymerization process. For many applications, it can be convenient to employ as the lens system an inverted microscope objective. In this example, the mask features' sizes are reduced by a factor that is dictated by the characteristics of the microscope objective and the other lenses in the system. Typically an additional lens is in the optical path between the field-stop slider and the objective of a microscope lens system. Then, for example, given a ×20 objective, a 7.8 times feature reduction results due to a 2.57× lens between the objective and the field-stop slider. In this case, a 350 µm-square mask feature results in synthesis of microstructure cuboids, i.e., rectangular parallelepiped objects, having 45 µm-long sides in the x-y plane, as defined in FIGS. 1-2.

The height of a microstructure in the z plane, as defined in FIGS. 1-2, is for most two-dimensional microstructures, set by the cross section of the microfluidic device and the non-polymerized lubricating layers in the device. For the oxygen-aided polymerization inhibition process example given above, a non-polymerized lubricating layer of between about 1 µm and about 5 µm in height is sufficient. With a non-polymerized lubricating layer of about 2.5 µm in thickness, then given a microfluidic device cross-sectional height of 20 µm a resulting polymeric microstructure is about 5 µm shorter, or in this example, about 15 µm tall in the z plane as defined in FIGS. 1-2.

For many applications, the fundamental limitations of a projection lithographic technique like that of the example described above are set by the optical resolution and depth of field of the lens objective employed. The resolution of an objective herein is meant to refer to the smallest distinguishable feature that can be discerned, and the depth of field is herein meant to refer to the length over which a beam of light emanating from an objective can be considered to have a constant diameter. In the projection lithography technique of the invention, optical resolution limits the minimum feature size that can be synthesized, and the depth of field restricts the length over which the sidewalls of a polymerized microstructure will be straight. An increase in optical resolution decreases the depth of field. In addition, the minimum feature size that can be printed on a transparency mask contributes to feature size limitations.

If a suitable transparency mask can be produced for a given application, no lens system need be employed in the projection lithography process. In the absence of a lens objective, illumination passes through a mask and is directed to a monomer stream in a microfluidic device without any reduction in feature size. The mask features are then identically reproduced in the polymerizing monomer stream.

The invention is not limited to a particular type of mask, and any suitable mask or illumination arrangement that enables the simultaneous shape-definition and polymerization of polymeric microstructures in a monomer stream can be employed. Apertures, ink masks, metallic masks such as chrome masks, photographic film, dynamic masks such as the digital micromirror devices described above, and other such masks and techniques can be employed. In general, all that is required is an ability to project or direct illumination toward a monomer stream in a microfluidic device.

Figure 5:
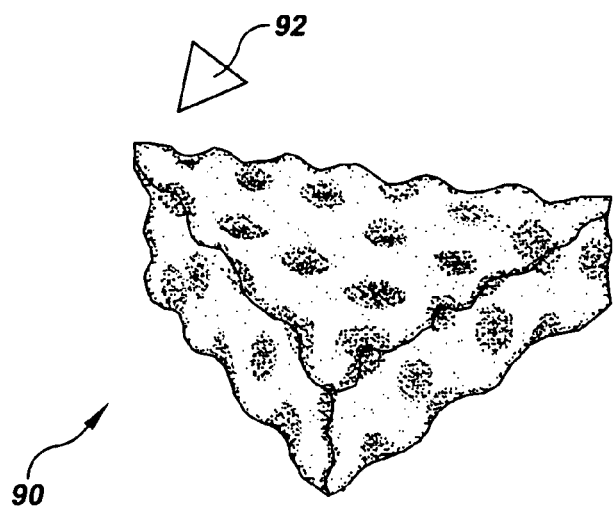
FIG. 5 is a schematic view of a polymeric microstructure including three-dimensional features, and the corresponding lithographic mask employed to produce each microstructure, in accordance with the invention.

Multiphoton illumination and multiple-beam lithographic techniques can also be employed, e.g., to produce three-dimensional microstructure features. FIG. 5 is a schematic view of an example polymeric microstructure 90 synthesized in accordance with the invention and including 3-D features in the microstructure. In this example, a triangular mask feature 92 is employed with laser interference lithography to lithographically define the microstructure as the laser illumination polymerizes the microstructure. The resulting microstructure is characterized by a matrix having interpenetrating holes throughout the structure. The added 3-D dimensionality to a polymeric microstructure of the invention can be employed for a range of applications for a selected functionality or other action. The invention is not limited to a particular 3-D technique or class of microstructures and enables a near-arbitrary 3-D customization of microstructure features.

The cross-sectional geometry of the microfluidic device employed in the synthesis process of the invention can also be tailored to customize microstructure geometry. FIGS. 6A-6E are schematic cross-sectional views of example microfluidic device geometries. In these examples, there is prescribed a microfluidic device assembly process that enables convenient fabrication of a wide range of device geometries.

Figure 6A:
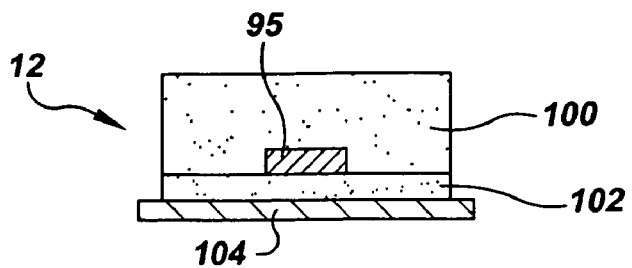
FIGS. 6A-6E are schematic cross-sectional views of five example microfluidic device cross sections that can be employed in accordance with the invention.

In FIG. 6A there is shown an example device 12 like that of FIGS. 1A-1B, having a rectangular cross sectional volume 95 through which a monomer stream can pass. Fabrication of this device can be conveniently carried out for polymeric device materials, e.g., PDMS. In such a scenario, a mold in, e.g., a silicon substrate that is lithographically patterned and etched with a selected device cross sectional geometry, is provided. A corresponding PDMS structure 100 is formed by conventional molding techniques with the substrate mold. The resulting PDMS structure 100 forms the top and sides of the device. A PDMS layer 102 is provided on a transparent support structure, e.g., a glass plate 104, to provide the bottom of the PDMS device. The PDMS structure 100 is mated with the PDMS layer 102 on the glass plate to form the hollow rectangular microfluidic device. This assembly process is particularly convenient and enables provision of a support structure such as a glass plate for the device.

Figure 6B:
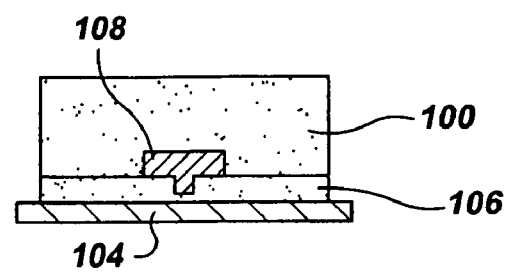
Figure 6C:
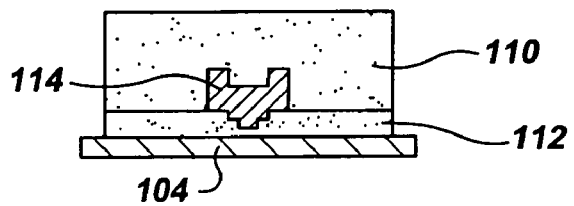

Referring now to the example of FIG. 6B, the top PDMS structure 100 can be molded as described above, with a patterned and molded PDMS layer 106 is provided on a glass plate 104. This enables a cross section, or channel, 108 having features along the width of the device. As shown in FIG. 6C, this example can be extended by employing multi-level lithographic techniques to pattern both a PDMS structure 110 and a PDMS layer 112. This combination of lithographic steps enables production of a complex device cross section 114.

Figure 6D:
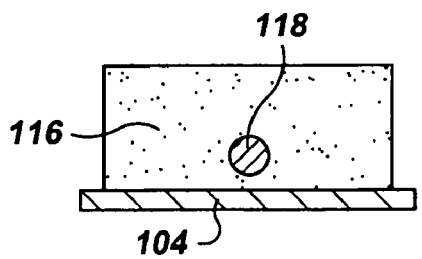
Figure 6E:
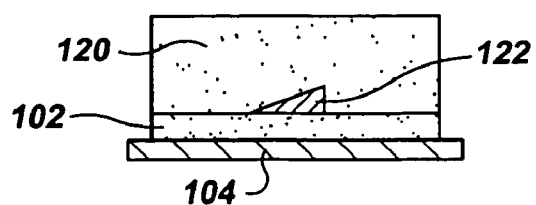

FIG. 6D schematically represents an example microfluidic device cross section wherein the PDMS structure 116 is molded around a tube or rod to produce a rounded cross section 118. The molded structure 116 can itself be supported directly on, e.g., a glass plate 104. FIG. 6E schematically represents an example microfluidic device wherein a PDMS structure 120 is formed using a grayscale lithographic technique to enable angled geometries across the width of the structure. An angled cross section 122 results from this configuration. Here a PDMS layer 102 can be provided on a glass plate 104 as described above, or lithographic definition of the PDMS layer can also be employed to add to features of the cross section profile.

The height of a microfluidic device cross section, in combination with the feature size of a projection mask, sets the exposure time required to fully polymerize microstructures in the photosensitive monomer example of FIG. 1 described above. The polymerization exposure time is inversely proportional to both the device cross section and mask feature size. When the extent of the channel in a direction aligned with the projected illumination is decreased or when the mask feature size is decreased, an increased polymerization duration is required. A reduction in mask feature size requires an increase in polymerization dose due to diffraction-induced limitations in, the optical train of a microscope employed for focusing illumination, or other optical system employed.

An increase in required polymerization duration in turn places a constraint on the maximum allowable velocity of a continuously-flowing monomer stream passing through a microfluidic device, to avoid unintended shape deformation of polymerized microstructures in the stream. In accordance with the invention, it can be preferred to specify a microstructure feature size tolerance and based on that tolerance and the polymerization duration required for the microfluidic device dimensions and the mask feature size, to determine a monomer stream flow rate that accommodates the specified microstructure feature size tolerance. The flow rate of the monomer stream can be controlled by, e.g., syringe pump operation, capillary action, pressure, electrokinetic force, or other selected operation.

As described above, stop flow lithography can be employed as an alternative to continuous flow lithography in accordance with the invention with a monomer stream in a microfluidic device like that of FIG. 1. In a stop flow lithography process, the monomer stream flow is brought substantially to a complete stop before a lithography-polymerization step is initiated. At the completion of the lithography-polymerization step, the monomer flow is resumed and the synthesized particles are completely flushed out of the region in the channel in which the lithography-polymerization takes place. This ensures that synthesized microstructures do not interfere with the polymerization of subsequent microstructures.

For many applications, the stop flow lithography technique can provide synthesized polymeric microstructure feature resolution that is improved over that of continuous flow lithography. The stop flow lithography technique can also achieve a microstructure synthesis through-put that is increased over that of continuous flow lithography because a higher average monomer stream flow rate can be employed, considering that the microstructure flushing step can be carried out at a high flow rate. Continuous flow lithography is in general mechanistically simpler than stop flow lithography and thereby can be preferred for applications in which the distinct advantages of stop flow lithography are not required. Stop flow lithography can be preferred to continuous flow lithography for applications employed to produce high-fidelity microstructures with small features, e.g., ~10 µm or less, or when it is desired to produce sharp interfaces between adjacent chemistries in a microstructure, as described below. The interface between two miscible streams is sharper for smaller residence times during which molecular species can diffuse between the adjacent streams. In a stop-flow lithography setup, one can polymerize immediately after stopping two rapidly-flowing streams to minimize the residence time and increase the sharpness of the interfaces.

Figure 7:
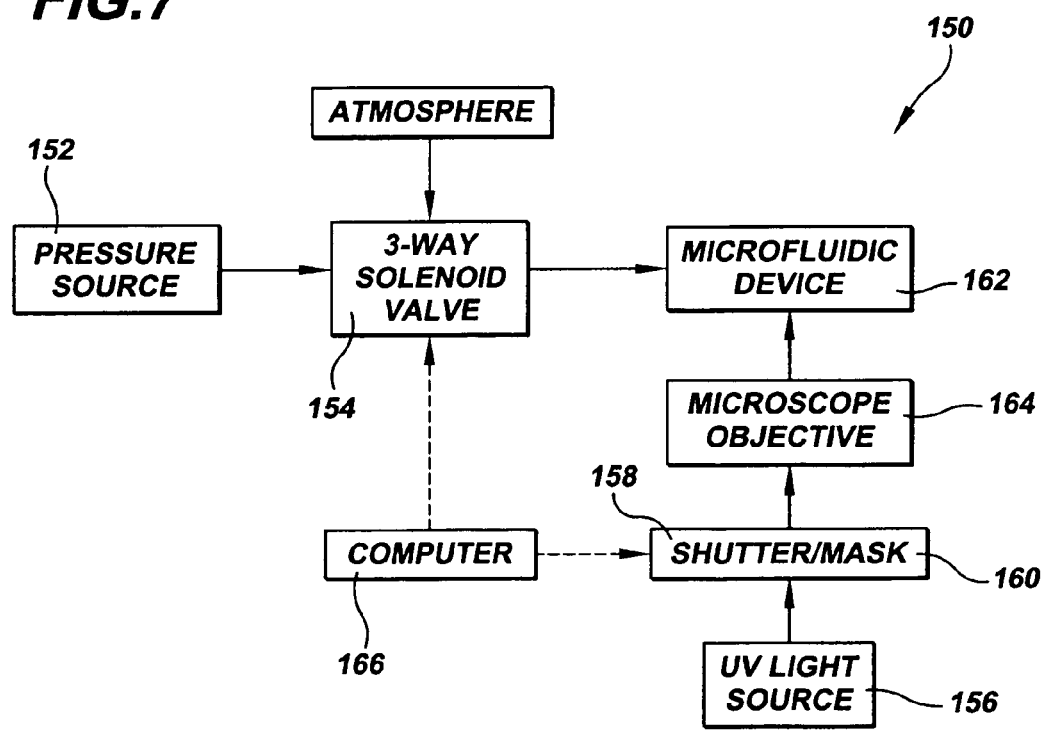
FIG. 7 is a block diagram of a stop flow polymeric microstructure synthesis control system in accordance with the invention.

FIG. 7 is a block diagram of the elements of an example stop flow lithography system 150 that can be employed for carrying out the photosensitive polymerization of microstructures as described with FIG. 1 above. The stop flow lithography system 150 includes a controlled pressure source 152 for pressure driven flow of a monomer stream and a 3-way valve 154 to stop and start pressure from the source 152. A pressure source can be preferred over a syringe pump for this application due to the better dynamic response of the pressure source arrangement.

A light source, e.g., a UV light source 156 is provided for projection lithography. A shutter 158 or other control mechanism is provided for controlling duration of the illumination and a mask 160 or other system is aligned with a microfluidic device 162 in the manner described above, and a microscope objective 164 or other lens system is provided, if desired, for reducing the illumination feature size. A computer 166 or other processing device or system is provided for synchronously controlling the shutter 158 and the valve 154 such that the monomer stream flow through the microfluidic device is coordinated to stop and start in unison with illumination of the monomer stream.

The valve and shutter can be controlled by way of, e.g., serial RS 232 connections, USB connections, through a data acquisition board, or other suitable connection, with suitable control software, such as LabVIEW, National Instruments Corp, Austin, Tex. Alternatively, a computer-controlled pressure transducer can be employed to adjust the monomer stream pressure between a specified flowing pressure and zero pressure of stopped flow. The pressure source can be provided as any suitable gas pressure source that can supply between, e.g., about 0-30 psi. The 3-way valve or the pressure transducer is connected to the microfluidic device through suitable tubing, e.g., through $\frac{1}{32}$" diameter Tygon® tubing that is fitted to the device by, e.g., a 10 µl pipette tip. In one example scenario, the pipette tip is filled with a volume of monomer stream and inserted in the microfluidic device for initiating monomer flow through the device. A compressed gas head can then be employed to drive the flow by attaching the tubing through which the air flows to the pipette tip.

While the system 150 of FIG. 7 has been described specifically for a stop flow lithography process, the system 150 can also be employed for controlling flow rate of a monomer stream in a continuous flow lithography process. In this mode of operation, the 3-way valve is maintained open and a constant pressure is applied to the monomer stream flowing through the device. The computer can here be employed for controlling monomer stream flow rate as a function of shutter speed.

Turning now to specific features of the polymer chemistry employed for microstructure synthesis processes of the invention, the processes can be conducted with any polymerizable liquid-phase monomer in which microstructure shapes can be defined and polymerized in a single lithography-polymerization step. Preferably the selected monomer also is characterized by a polymerization reaction that can be terminated with a termination species. The terminating species, lithographic illumination, and monomer constituents are therefore selected in cooperation to enable all such functionality of the process of the invention.

As explained above, one particularly well-suited class of polymers is that class of polymerizable monomers that undergo free-radical-initiated polymerization, e.g., by UV illumination, visible light illumination, thermal initiation, or other initiating radiation or agent. Such monomer systems preferably include one or more unsaturated (double bond) species that undergo free-radical-initiated polymer chain extension. Examples of such monomers include acrylates, multi-acrylates, methacryates, multi-methacrylates, vinyls, and any blends thereof.

Table I below is a non-exhaustive listing of a range of monomers that can be employed for polymeric microstructure synthesis in accordance with the invention.

TABLE I

Allyl Methacrylate
Benzyl Methylacrylate
1,3-Butanediol Dimethacrylate
1,4-Butanediol Dimethacrylate
Butyl Acrylate
n-Butyl Methacrylate
Diethyleneglycol Diacrylate
Diethyleneglycol Dimethacrylate
Ethyl Acrylate
Ethyleneglycol Dimethacrylate
Ethyl Methacrylate
2-Ethyl Hexyl Acrylate
1,6-Hexanediol Dimethacrylate
4-Hydroxybutyl Acrylate
Hydroxyethyl Acrylate
2-Hydroxyethyl Methacrylate
2-Hydroxypropyl Acrylate
Isobutyl Methacrylate
Lauryl Methacrylate
Methacrylic Acid
Methyl Acrylate
Methyl Methacrylate TABLE I-continued Monoethylene Glycol
2,2,3,3,4,4,5,5-Octafluoropentyl Acrylate
Pentaerythritol Triacrylate
Polyethylene Glycol (200) Diacrylate
Polyethylene Glycol (400) Diacrylate
Polyethylene Glycol (600) Diacrylate
Polyethylene Glycol (200) Dimethacrylate
Polyethylene Glycol (400) Dimethacrylate
Polyethylene Glycol (600) Dimethacrylate
Stearyl Methacrylate
Triethylene Glycol
Triethylene Glycol Dimethacrylate
2,2,2-Trifluoroethyl 2-methylacrylate
Trimethylolpropane Triacrylate
Acrylamide
N,N,-methylene-bisacryl-amide
Phenyl acrylate
Divinyl benzene For those monomers that are photo-polymerizable, a photoinitiator species is included in the monomer stream to enable the polymerization process. Effectively any chemical that can produce free-radicals in the fluidic monomer stream as a result of illumination absorption can be employed as the photoinitiator species. There are in general two classes of photoinitiators. In the first class, the chemical undergoes unimolecular bond cleavage to yield free radicals. Examples of such photoinitiators include Benzoin Ethers, Benzil ketals, a-Dialkoxy-acetophenones, a-Amino-alkylphenones, and Acylphosphine oxides. The second class of photoinitiators is characterized by a bimolecular reaction where the photoinitiator reacts with a coinitiator to form free radicals. Examples of such are Benzophenones/amines, Thioxanthones/amines, and Titanocenes (vis light).

Table II below is a non-exhaustive listing of a range of photoinitiators that can be employed with a photo-polymerizable monomer for polymeric microstructure synthesis in accordance with the invention.

TABLE II

| Trade Name (CIBA) | Chemical Name |
| --- | --- |
| IRGACURE 184 | 1-Hydroxy-cyclohexyl-phenyl-ketone |
| DAROCUR 1173 | 2-Hydroxy-2-methyl-1-phenyl-1-propanone |
| IRGACURE 2959 | 2-Hydroxy-1-[4-(2-hydroxyethoxy)phenyl]-2-methyl-1-propanone |
| DAROCUR MBF | Methylbenzoylformate |
| IRGACURE 754 | oxy-phenyl-acetic acid 2-[2 oxo-2 phenyl-acetoxy-ethoxy]-ethyl ester and oxy-phenyl-acetic 2-[2-hydroxy-ethoxy]-ethyl ester |
| IRGACURE 651 | Alpha, alpha-dimethoxy-alpha-phenylacetophenone |
| IRGACURE 369 | 2-Benzyl-2-(dimethylamino)-1-[4-(4-morpholinyl)phenyl]-1-butanone |
| IRGACURE 907 | 2-Methyl-1-[4-(methylthio)phenyl]-2-(4-morpholinyl)-1-propanone |
| DAROCUR TPO | Diphenyl(2,4,6-trimethylbenzoyl)phosphine oxide |
| IRGACURE 819 | Phosphine oxide, phenyl bis (BAPO) (2,4,6-trimethyl benzoyl) |
| IRGACURE 784 | Bis(eta 5-2,4-cyclopentadien-1-yl)Bis[2,6-difluoro-3-(1H-pyrrol-1-yl)phenyl]titanium |
| IRGACURE 250 | Iodonium, (4-methylphenyl)[4-(2-methylpropyl)phenyl]-hexafluorophosphate(1-) |

In accordance with the invention, the monomer stream in which polymeric microstructures are to be synthesized can incorporate diverse functional moieties that produce selected microstructure functionality, for addressing microstructure applications in, e.g., ambient sensing, self-assembly, rheology, biosensing, drug delivery, and other applications. The moieties can be chemically attached in the microstructure, e.g., by covalent incorporation, or can be physically attached or entrapped in the microstructure. Covalently-incorporated moieties can be provided as monomers, in the monomer stream, that are polymerized by the lithography-polymerization step of the microstructure synthesis. Monomers can be included which alone or in combination with copolymerized species in a synthesized polymeric microstructure provide a selected functionality.

For example, a monomer species can be included in the monomer stream for synthesizing temperature-sensitive polymer microstructures. The monomer N-isopropylacrylamide, or other suitable monomer, can here be employed. A monomer species can be included in the monomer stream for synthesizing pH-responsive polymer microstructures; monomers such as acrylic acid, methacrylic acid, or other suitable species can here be employed. A monomer species can further be included in the monomer stream for synthesizing photosensitive polymer microstructures; a copolymer of Azobenzene, N,N-Dimethylacrylamide, or other suitable monomer can here be employed. A monomer species can be included in the monomer stream to synthesize antigen-responsive polymer microstructures. Here, goat anti-rabbit IgG coupled with N-succinimidylacrylate, or other suitable monomer, can be employed. With these examples, it is demonstrated that a wide range of functionality can be imparted to the synthesized microstructures by the inclusion of selected monomer species.

Further in accordance with the invention, biodegradable monomers, as well as modified biological material, can be included in the monomer stream. For example, DNA or RNA can be included in the monomer stream. Such can be custom-synthesized or obtained commercially. Polypeptides, antibodies, enzymes, or other such species can also be included in the monomer stream. Each selected species can be modified as-desired to enable covalent incorporation in a polymeric microstructure matrix as the microstructure is polymerized. Fluorophores and chromophores, such as fluorescein diacrylate and rhodamine methacrylate, or other molecules or parts of a larger molecule that can be excited by light to emit fluorescence or selectively absorb light at particular wavelengths, can further be included in the monomer stream.

Further in accordance with the invention, selected entities can be provided in a monomer stream to be physically entrapped in the polymeric matrix of a polymer microstructure as the microstructure is polymerized by the lithography-polymerization step of the invention. For example, particles such as quantum dots, emulsified liquid droplets, gas bubbles, electrically conductive and metallic particle species, gold or silver filings or particles, magnetically-sensitive particle species, such as nanometer-sized magnetite or maghemite particles, carbon nanotubes, three-dimensional micromachined or microfabricated structures of microelectronic or other materials, and other species, can be included. If necessary or desirable, these can be physically or chemically linked to one or more of the monomers provided in the monomer stream. Further, liquid crystals, viruses, whole cells or cellular components, such as mitochondria, proteins, enzymes, nucleic acids, and other such species, can be included in the monomer stream for entrapment in a polymeric microstructure matrix. Various porogens can be added to the monomer stream to control the porosity of the resulting polymeric microstructures, such as surfactants, gas bubbles or dissolvable microparticles, or nanoparticles such as PMMA nanoparticles.

Figure 8A:
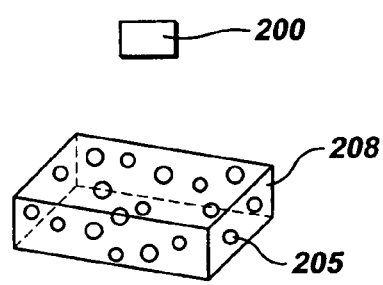
FIGS. 8A-8C are schematic views of example polymeric microstructures including selected moieties, and the corresponding lithographic mask employed to produce each microstructure, in accordance with the invention.
Figure 8B:
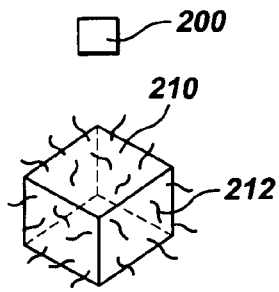
Figure 8C:
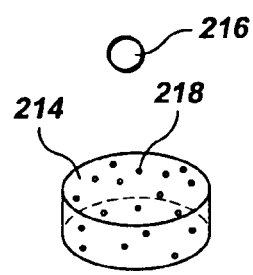

FIGS. 8A-8C are schematic views of example polymeric microstructures synthesized in accordance with the invention and including a selected moiety. In the example of FIG. 8A, a square mask shape 200 is employed and a selected moiety 205 is incorporated into the polymer matrix of the resulting rectangular microstructure 208. Beads, emulsion droplets, bubbles, cells, particles or other selected entity, such as those described above, or other species, can be included here.

FIG. 8B is a schematic view of an example polymeric microstructure 210 that is also synthesized with a square mask feature 200, but here DNA strands 212 are incorporated into the polymer matrix of the structure. FIG. 8C is a schematic view of an example polymeric microstructure 214 that is synthesized with a circular mask feature 216. The resulting circular microstructure 214 here includes proteins 218 or other moiety incorporated in the polymer matrix of the microstructure. These examples are not meant to be limiting but to demonstrate a range of polymeric microstructures that can be produced with selected species incorporated into the microstructure polymer matrix.

The selected one or more species to be added to a monomer for incorporation during the polymeric microstructure synthesis can be mixed with a monomer by, e.g., vortex mixing, sonication, or other selected technique. Additionally, surfactants can be included with a monomer to stabilize porogens, moieties, or other added entities from agglomeration. Some species added to a monomer can produce a dispersed phase of particles in the continuous-phase of the fluidic monomers in a monomer stream. In accordance with the invention, such a dispersed phase does not constitute that phase which is polymerized to produce microstructures. As explained above, the continuous phase of the monomer stream is that which is polymerized, with a dispersed phase, if such is not covalently bonded in the microstructure matrix, being entrapped in the resulting synthesized polymeric microstructure shapes. The dispersed phase does not in general set the shape or geometry of the synthesized polymeric microstructure shapes; it is the lithographic mask shapes imposed on the polymerizing continuous phase that set microstructure shape.

Figure 9A:
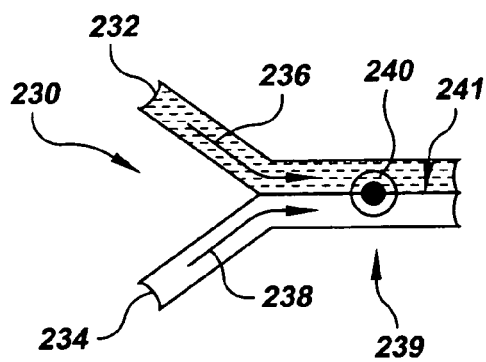
FIGS. 9A and 9C are schematic views of example flow structures for enabling the polymeric microstructure synthesis in accordance with the invention across multiple distinct monomer streams.

In accordance with the invention, polymeric microstructures can be controllably synthesized to include two or more functionalities and/or chemistries in an anisotropic arrangement across the plane of a microstructure. FIGS. 9A and 9C are schematic planar views of two example flow configurations for enabling such synthesis. In the example flow configuration of FIG. 9A, a Y-shaped flow structure 230 is provided having two ports 232, 234, with each port designated to introduce a distinct selected monomer stream 236, 238, respectively, to the cross sectional volume of a microfluidic device like that described above, and here represented schematically at the region of adjacent alignment 239 between the two streams 236, 238.

To synthesize microstructures from the two adjacent monomer streams, a selected mask shape, e.g., the ring shape 240 in FIG. 9A, is employed in the lithography-polymerization synthesis of the invention described above. In a first example synthesis process, the mask 240 and a source of illumination are aligned across the interface 241 between the two streams in a selected manner to incorporate a correspondingly selected proportion of each stream in the microstructure to be synthesized. In a second example synthesis process, the mask and source of illumination are aligned through the two streams, from a side of the streams, as in the example configuration of lens system 35 of FIG. 1B, to incorporate a proportion of each stream through the thickness of the microstructure. In addition or alternatively, the relative flow rates of the two streams can be controlled to control the proportion of each stream incorporated in a microstructure. With these techniques, there is produced a polymeric microstructure that incorporates both monomer stream constituents in a desired proportion.

Figure 9B:
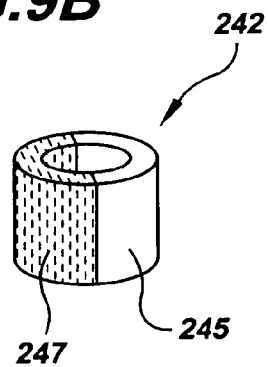
FIGS. 9B and 9D are schematic views of example polymeric microstructures including multiple distinct polymeric regions produced by the arrangement of FIGS. 9A and 9C, respectively, in accordance with the invention.
Figure 9C:
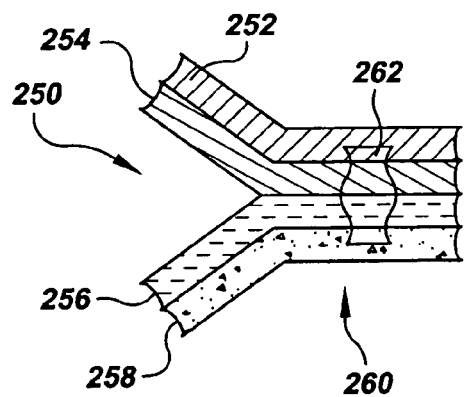

FIG. 9B is a schematic view of an example polymeric microstructure 242 resulting from a lithography-polymerization step across the two monomer streams as in FIG. 9A. The microstructure includes a first volume 245 corresponding to one of the monomer streams 238 and a second volume 247 corresponding to the other monomer stream 236. Although the two volumes 245, 247 are shown to be substantially equal in the microstructure of FIG. 9B, such is not required, and as explained above, any proportion can be selected. A two-component microstructure like that of FIG. 9B is known generally as a Janus particle, or two-faced particle. Janus particles have been demonstrated to be particularly useful for a range of applications and the high-through-put, reliable, and reproducible nature of the polymeric synthesis process of the invention enables production of Janus particles in a practical manner.

Figure 9D:
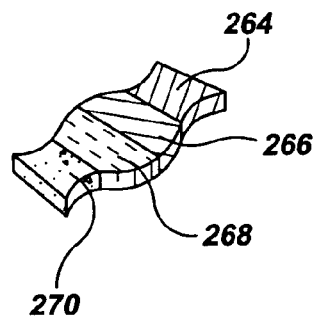

Referring to FIG. 9C, in accordance with the invention, the concurrent flowing of three or more monomer streams through a microfluidic device can be employed for polymerizing microstructures across the streams to generate microstructures having many adjacent chemistries and/or functionalities. In FIG. 9C there is schematically shown an example Y-shaped flow structure 250 that accommodates four distinct monomer streams 252, 254, 256, 258. The streams are all directed through a microfluidic device, represented here schematically by the adjacent alignment 260 of the streams. A mask shape 262 is provided for lithography and polymerization across the four streams. The resulting polymeric microstructure 264 is schematically shown in FIG. 9D. Each of the four monomer streams 252, 254, 256, 258 produces a corresponding microstructure volume 264, 266, 268, 270. The ability to tune the proportion of this number of chemistries in the microstructure enables great flexibility in the design of so-called barcoded microstructures providing multiple constituents.

Figure 10A:
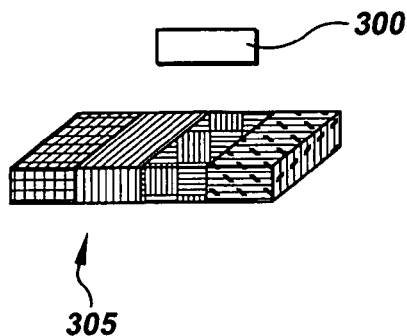
FIGS. 10A-10H are schematic views of example polymeric microstructures including multiple distinct polymeric regions, and the corresponding lithographic mask employed to produce each microstructure, in accordance with the invention.
Figure 10B:
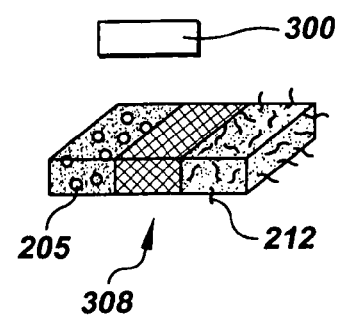

FIGS. 10A-10H are schematic views of additional example polymeric microstructures that can be synthesized by lithographically defining a microstructure shape while polymerizing that shape across or through a plurality of concurrently flowing monomer streams. In the example of FIG. 10A a rectangular mask 300 and four monomer streams are employed to produce a corresponding rectangular, four-part microstructure 305. In the example of FIG. 10B, the rectangular mask 30 is employed with three monomer streams, one of which includes, e.g., a porogen 205 and one of which includes, e.g., DNA strands 212, in the manner described above, to produce a three-part microstructure 308 having multiple distinct functionalities.

Figure 10C:
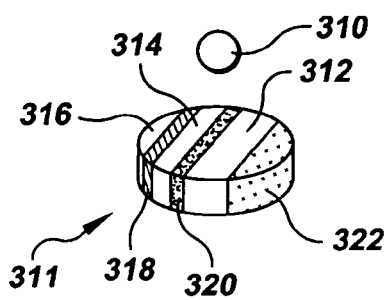

In the example of FIG. 10C a circular mask 310 is employed with six monomer streams, three of which are identical and three of which are distinct, to produce a disc microstructure 311 that incorporates three regions 312, 314, 316 of identical composition separated by three regions 318, 320, 322 of distinct composition. In this example microstructure, each of the six resulting regions of the microstructure is characterized by a distinct width, set by the flow rates of the corresponding monomer streams.

Figure 10D:
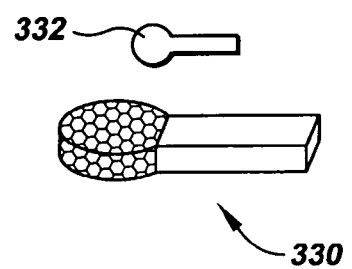
Figure 10E:
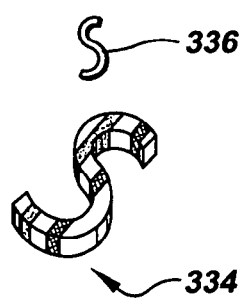

FIG. 10D schematically shows a polymeric microstructure 330 synthesized across two monomer streams and employing a mask shape that provides a distinct feature geometry for the microstructure region corresponding to each of the monomer streams. FIG. 10E schematically shows a polymeric microstructure 334 synthesized across five monomer streams and employing an S-shaped mask 336. The differentiation in polymer species is preserved across the structure.

In accordance with the invention, the co-flowing monomer streams employed to synthesize polymeric microstructures can be miscible, chemically similar streams. In this case, the interface between different regions in a resulting microstructure is not sharp, due to molecular diffusion. Diffusion-limited mixing that is characteristic of laminar flow can be exploited to ensure that the streams flow distinctly through a microfluidic device, but molecular diffusion between adjacent polymerized regions can here occur. If co-flowing monomer streams instead are immiscible, then a sharp interface between synthesized polymeric regions can be enforced, producing microstructures having regions with sharply-segregated chemistries and differing surface energies.

Figure 10F:
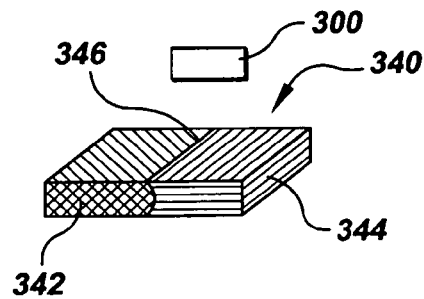

FIG. 10F is an example of a polymeric microstructure 340 synthesized across two monomer streams one of which provides a hydrophilic polymer region 342 and one of which provides a hydrophobic polymer region 344. The interface 346 between the two regions in the microstructure is characteristically curved due to the disparate surface energies of the two regions. The amphiphilic nature of such a microstructure can be exploited to enable self-assembly of populations of such microstructures.

Figure 10G:
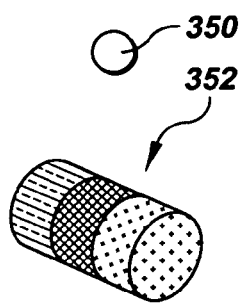
Figure 10H:
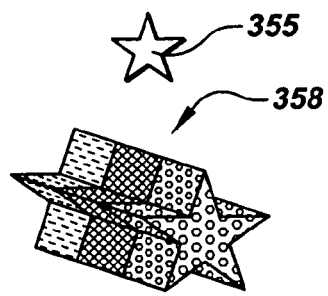

FIGS. 10G-10H are schematic views of polymeric microstructures 352, 358, synthesized by lithography and polymerization through multiple co-flowing monomer streams rather than across co-flowing monomer streams. As shown in FIG. 10G, employing a circular mask 350, a three-material microstructure is produced in which the composition of the circular cross section of the structure is changed through the thickness of the structure. Similarly, as shown in FIG. 10H, a star-shaped polymeric microstructure is synthesized across four differing monomer streams to produce a microstructure 358 having a differing composition through the thickness of the star-structure, with the composition constant in a given star-shaped plane of the structure.

EXAMPLE I

A number of microfluidic devices were fabricated by first patterning a silicon substrate with photoresist, SU-8, from Microchem, Newton, Mass., to define a mold structure corresponding to a rectangular microfluidic device cross section as in FIG. 6A. PDMS provided as Sylgard® 184 silicon elastomer, from Dow Corning, Midland, Mich., was poured into the resulting positive-relief channels of the silicon substrate to mold an upper PDMS device structure 100 as in FIG. 6A. Rectangular microfluidic devices of 1 cm in length and three different channel widths were defined by the patterning, namely, 20 µm-wide, 600 µm-wide, and 1000 µm-wide, and three different rectangular microfluidic channel heights were defined by the patterning, namely, 10 µm in height, 20 µm in height, and 40 µm in height A layer of PDMS was spin-coated on glass slides to form bottom surfaces for the microfluidic devices as in FIG. 6A. The molded upper PDMS device structures were mated with PDMS-coated glass slides to form complete microfluidic devices.

For carrying out the lithography-polymerization operations of the invention with the microfluidic devices, a selected one of the devices was mounted on an inverted microscope, the Axiovert 200 inverted microscope, from Carl Zeiss MicroImaging, Inc., Thornwood, N.Y. A charge-coupled device camera (CCD), the Hitachi KP-M1A monochrome CCD camera, Hitachi America, Ltd., Tarrytown, N.Y., was positioned to acquire images during the microfluidic operations. NIH Image software was employed to capture and process the CCD images.

Dark-field transparency photomasks of selected microstructure shapes were designed in software with a design tool, AutoCAD® 2005, Autodesk, Inc., San Rafael, Calif., and printed by high-resolution printer by CAD Art Services, Poway, Calif. The resulting transparency mask was inserted into the field stop of the microscope. A source of UV illumination was provided by a 100 W OSRAM HBO® mercury short arc lamp, from OSRAM Sylvania, Danvers, Mass. A filter set, 11000v2: UV, from Chroma Technology Corp, Rockingham Vt., allowing wide UV excitation, was employed to enable selection of a desired illumination wavelength of 365 nm. An electro-programmable shutter system, UniBlitz® VS25, Vincent Ass., Rochester, N.Y., was driven by a computer-controlled shutter driver controller, VMM-D1, Vincent Ass., Rochester, N.Y., to produce specified pulses of UV light.

A monomer solution of poly(ethylene glycol)(400) diacrylate (PEG-DA), Polysciences, Warrington, Pa., was employed including a photoinitiator of 5% (v/v) DAROCUR® 1173, Ciba Specialty Chemicals, Tarrytown, N.Y. The viscosity of the PEG-DA was reported by the supplier to be 57 cP at 25° C. Additional monomer solutions of trimethylpropane triacrylate, 1,6-hexanediol diacrylate, and tri(propylene glycol) diacrylate were also prepared. A selected one of the solutions was loaded into a syringe pump, KDS 100 single-syringe infusion pump, from kdScientific, Holliston, Mass., for delivery through a selected one of the microfluidic devices.

Pulses of UV light were directed through the transparency mask and the microfluidic device to a monomer solution passing through the microfluidic device. As polymeric microstructures were synthesized by the pulses in the monomer stream, the microstructures were carried through the device in an un-polymerized volume of monomer resulting from oxidation-induced polymerization inhibition at the device walls. The monomer-microstructure solution was collected in a reservoir positioned at the output of the device's rectangular channel. The microstructures in the solution were collected by centrifuge, washed, and then re-suspended three times in ethanol to dissolve any unpolymerized monomer remaining on the microstructures. The microstructures were then washed three times in water and then suspended in water.

Four different microscope objectives were employed in separate microstructure synthesis processes, namely, 20×, 40×, 63×, and 100× objectives. Table III below provides the actual magnification, theoretical resolution, practical resolution, and depth of field for each of the objectives.

TABLE III

| Objective | Actual Magnification | Numerical Aperture (NA) | Theoretical Resolution (µm) | Practical Resolution (µm) | Depth of Field (µm) |
| --- | --- | --- | --- | --- | --- |
| 20× | 7.8 | 0.5 | 0.37 | 1.29 | 15.69 |
| 40× | 15.6 | 0.75 | 0.24 | 0.64 | 5.38 |
| 63× | 24.5 | 1.2 | 0.15 | 0.41 | 2.13 |
| 100× | 38.9 | 1.4 | 0.13 | 0.26 | 1.2 |

The actual magnification factor is the ratio by which a mask shape size was reduced when projected to the monomer stream in a microfluidic device. This is different from the magnification of the objective because of an additional 2.57× lens in the optical path between the field-stop slider and the objective. The theoretic resolution was calculated using $$\text{Rayleigh's formula} = \frac{0.5\lambda}{NA},$$

where λ is the 365 nm wavelength of illumination employed and NA is the numerical aperture of the objective. The practical resolution is the size to which a 10 μm mask feature was reduced using the different objectives. The depth of field was calculated using an equation provided by the lens manufacturer, where $$DOF(\mu m) = \frac{1000}{7NA} + \frac{\lambda}{2NA^2}.$$

This demonstrates that higher magnification objectives provide greater resolution but lower depth of field.

Analysis of the CCD images of the lithography-polymerization process determined that the microstructures were rapidly formed, in less than about 0.1 s, due to rapid polymerization kinetics of the selected monomers. Oxygen-aided polymerization inhibition near the PDMS surfaces allowed microstructure flow within an unpolymerized monomer stream through the complete length of the device. Triangles, squares, hexagons, posts, and other microstructure geometries like that of FIGS. 3-4 were synthesized. All of the particles showed good fidelity to the original mask features and had straight sidewalls.

EXAMPLE II

Square polymeric microstructures were synthesized in the manner of Example I with square mask features ranging in edge length from 10 μm to 500 μm. The microstructure synthesis was duplicated for a 20× objective and a 40× objective. The three microfluidic devices described in Example I were employed, having channel heights of 10 μm, 20 μm, and 40 μm. The PEG-DA and DAROCUR® 1173 photoinitiator monomer stream of Example I was employed in the microfluidic devices, with the steam flow stopped during the lithography-polymerization step, in the stop flow process described above. The resulting microstructures were collected and analyzed as in Example I.

Figure 11A:
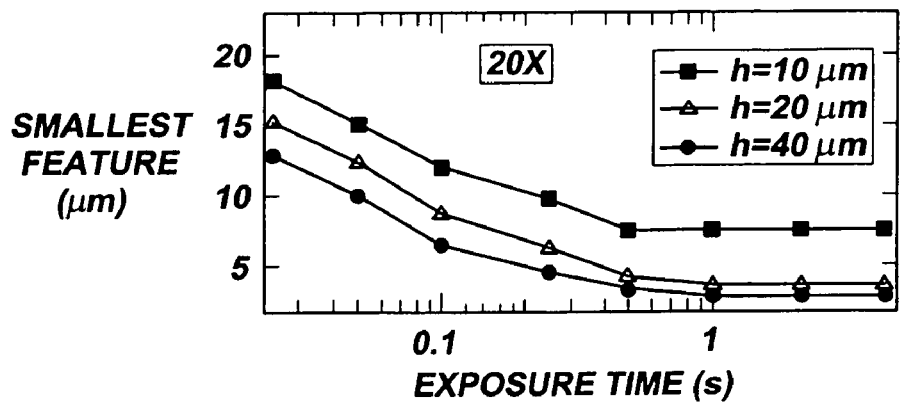
FIGS. 11A-11B are plots of measured polymeric microstructure feature size as a function of illumination exposure duration for three microfluidic device channel heights in the system of FIG. 1A and for a 20× and 40× microscope objective, respectively.
Figure 11B:
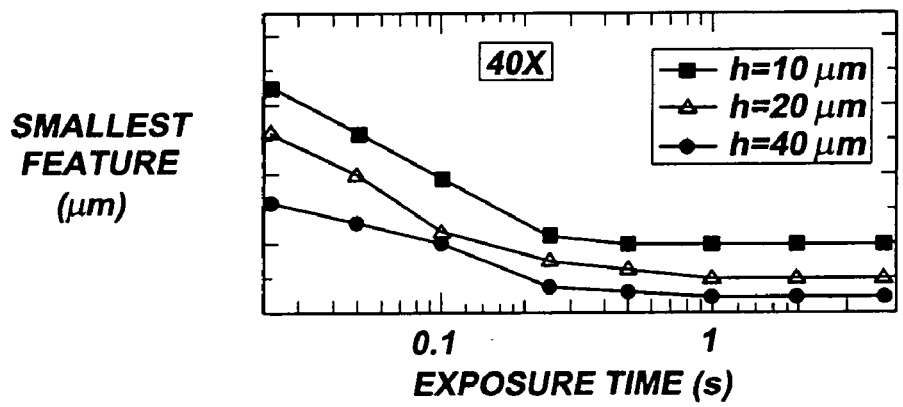

The microstructure analysis was conducted to determine the smallest mask feature that could be polymerized at a given exposure time in the channels of varying height. FIG. 11A is a plot of the smallest mask feature that could be polymerized, as a function of exposure time, for the 20× objective; FIG. 11B is a plot of the smallest mask feature that could be polymerized, as a function of exposure time, for the 40× objective. This determination was made by noting when a square of a given size was polymerized within a tolerance of 10% of a corresponding mask square. As the feature size or the channel height was decreased, longer exposure times were required to polymerize the square microstructures.

EXAMPLE III

One of the microfluidic devices of Example I having a cross section channel height of 38 μm (intended as 40 μm) was adapted by replacing the PDMS-coated glass slide with an uncoated glass slide, and polymeric microstructure synthesis was carried out with the monomer as in Example I. It was found that the synthesized microstructures stuck to the glass plate. This result is recognized to be due to the absence of the oxygen inhibition effect enabled by the PDMS coating in Example I, thereby allowing the synthesized microstructures to polymerize all the way to the glass surface.

Polymeric microstructures were synthesized in the manner of Example I with a PDMS-coated glass slide device and with an uncoated glass slide device, both having a cross-sectional channel height of 38 μm. An exposure time, $t_{exp}$, of 0.1 s, a 360 μm square mask shape, and a 20× objective were employed with each of the two devices.

Microstructures synthesized with the two microfluidic devices were collected as in Example I above and analyzed. Microstructures synthesized with the uncoated glass slide device were characterized by a height of 35.5 μm. Microstructures synthesized with the PDMS-coated glass slide device were characterized by a height of 33 μm. Given that an oxygen-aided inhibition layer was formed during synthesis with the coated glass slide device, it was determined that the thickness of the unpolymerized lubricating layer was 2.5 μm at both the top and bottom walls of the device.

This experiment was repeated for rectangular microfluidic device channel heights of 10 μm, 40 μm and 75 μm. For all channel heights, a polymerization inhibition layer thickness of 2.5 μm was measured. This result demonstrates that the inhibition layer thickness is independent of the cross-sectional height of the microfluidic device.

EXAMPLE IV

A transparency mask was produced as in Example I having features of differing sizes ranging from 10 μm to 500 μm. A fluorescein solution was employed as a monomer stream and the lithography-polymerization process of Example I was conducted. Microstructures synthesized by the process were collected and analyzed in the manner of Example I.

It was found that the light passing through the transparency mask in the field-stop plane of the microscope objective had a feature size-dependent intensity below a critical feature size of 250 μm. Above this critical feature size, the light intensity was equal through any mask feature dimensions and led to the polymerization of all such features in equal exposure durations. Below this critical size, the beam intensity was found to decrease with the size of the feature. This measured variation in intensity is recognized to be caused by clipping of the light passing through the mask, resulting from the increasing divergence of the light beam as the size of the aperture was decreased.

EXAMPLE V

The lithography-polymerization process of Example I was conducted with the microfluidic devices having rectangular channel heights of 10 μm, 20 μm, and 40 μm, and employing the 20× objective and the PEG-DA and photoinitiator monomer stream. Four different polymerization processes were carried out, with the velocity of the monomer stream varied between about 100 μm/s and about 1700 μm/s between the processes. Polymerized microstructures synthesized by the processes were collected and analyzed as in Example I.

Figure 12:
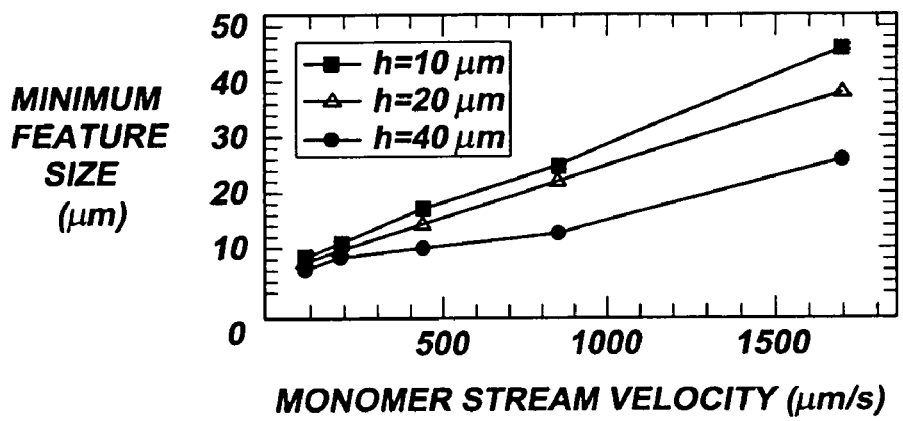
FIG. 12 is a plot of measured minimum feature size as a function for monomer stream velocity for three microfluidic device channel heights.

FIG. 12 is a plot of the minimum measured mask feature size that could be polymerized, with a tolerance factor of 10% in length scale, at a given velocity of the PEG-DA monomer stream. This data can be employed as a guide to determine the maximum monomer stream velocity that can be employed to synthesize a selected mask feature size. Lower monomer stream velocities were required to generate microstructures having smaller features, while larger microstructures could be synthesized at higher monomer stream velocities.

EXAMPLE VI

The lithography-polymerization process of Example I was conducted with a two-port flow structure fabricated in the manner of the one-port structure of Example I, but here employing a Y-shaped geometry like that of FIG. 9A, for producing rectangular Janus particles. The cross-sectional channel region in which the monomer streams were co-flowing was of a height of 200 µm and a width of 20 µm. In a first port of the structure was directed a flow of the PEG-DA and DAROCUR® 1173 monomer stream of Example I. In the second port of the structure was directed a flow of DAROCUR® 1173 and PEG-DA with a rhodamine-labelled crosslinker, a 0.005 wt % solution of the fluorescent methacryloxyethyl thiocarbamoyl rhodamine B, from Polysciences, Inc., Warrington, Pa., to fluorescently label the polymer. A rectangular mask feature was aligned across the flow of the two monomer streams, and the lithography-polymerization was carried out as in Example I, with the polymerized microstructures collected and analyzed. It was verified by fluorescence microscopy that the fluorescently labeled and the non-labeled sections were distinctly formed as in FIG. 9B.

EXAMPLE VII

The lithography-polymerization process of Example VI, with the experimental conditions of Example I, was conducted with two-port PDMS Y-shaped microfluidic devices having a rectangular cross sectional channel width of 200 µm and 300 µm, and a height of 30 µm. A reservoir was cut in each of the PDMS microfluidic devices to collect the synthesized microstructures. The shutter control was set to provide a lithographic exposure time of 0.03 s; with a pause of 5 s between successive exposures.

Amphiphilic polymeric microstructures were synthesized with a hydrophobic phase monomer stream consisting of a 5% (v/v) DAROCUR® 1173, photoinitiator in tri(methylpropane) triacrylate, (TMPTA) Polysciences Inc., Warrington, Pa. A hydrophilic phase monomer stream was provided consisting of 5% (v/v) solutions of the DAROCUR® 1173 photoinitiator in 65% aqueous solution of poly(ethylene glycol) (600) (PEG-DA). Because TMPTA is insoluble in water, the two monomer streams were immiscible. Both PEG-DA and TMPTA are reported by the supplier to have viscosities of 90 cP and 106 cP, respectively, at 25° C.

The two monomer streams were controlled with a syringe pump to a flow velocity between about 100 and about 300 µm/s, constraining the flow regime to one in which parallel co-flow of the two streams was enforced. Because the two monomer streams were immiscible, they cooed all the way to the exit of the microfluidic device. This led to a segregation of the two phases all along the interface and was convenient for the formation of large numbers of microstructures where diffusive mixing might otherwise have constrained the region available for polymerization.

Transparency masks were produced in the manner of Example I with microstructure wedge shapes that fall in the spectrum of shapes between triangles and rectangles. Such are the two-dimensional analogs of amphiphilic molecules as represented by objects in the spectrum of shapes between a cone and a cylinder, where the body of the object represents the hydrophobic tail and the hydrophilic heat is represented by a circular face. This spectrum of shapes is used to show the effect of geometry on packing.

Figure 13:
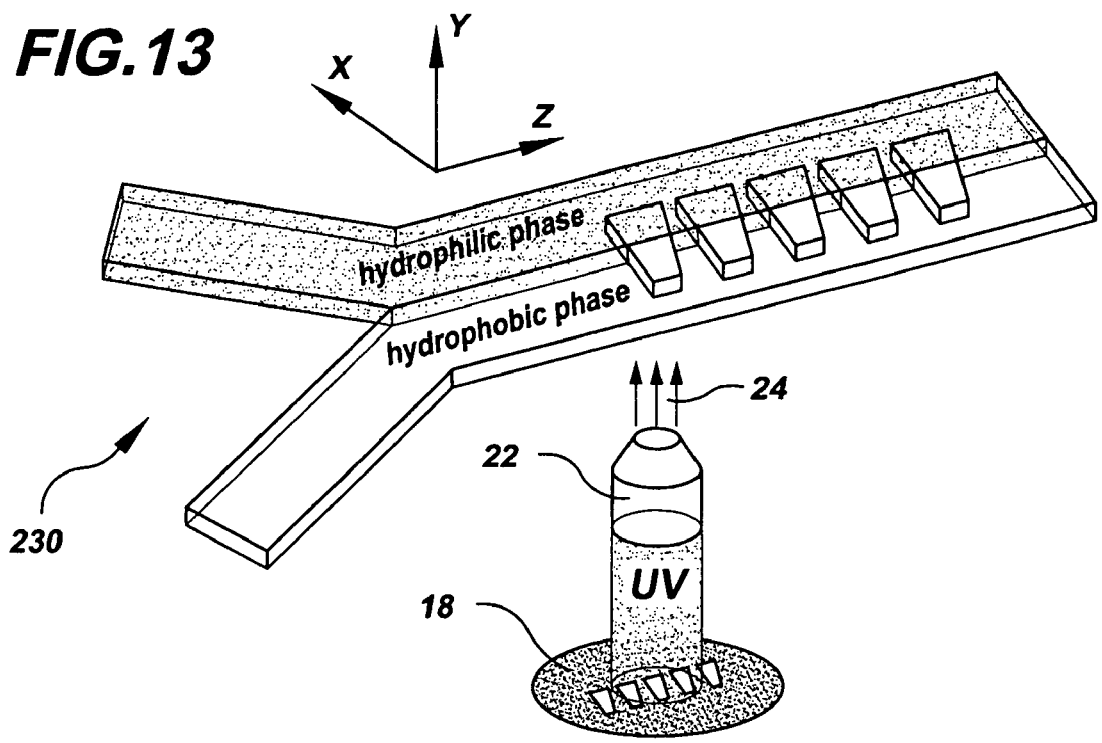
FIG. 13 is a schematic view of a flow structure enabling polymeric microstructure synthesis in accordance with the invention across a hydrophilic monomer stream and a hydrophobic monomer stream.

FIG. 13 is a schematic representation of the lithography-polymerization process with this mask including a row of 5 wedge shapes for projection to the two flowing monomer streams, such that wedge-shaped microstructures were polymerized, five at a time, across the co-flowing streams. A 20× microscope objective was employed, resulting in microstructures having that were approximately ⅛th of their mask size. Copolymerization of the two acrylates used led to a chemical linkage of the hydrophilic and hydrophobic sections at their interface, lending stability to the microstructures formed. As the lithography-polymerization process proceeded, wedge-shaped microstructures were formed and flowed continuously through the microfluidic device in unpolymerized monomer flow resulting from oxygen-induced inhibition of polymerization at PDMS surfaces in the manner described above.

The microstructures were collected in unpolymerized monomer in the manner described above and then dispersed in ethanol in order to avoid clustering. Because both the hydrophilic and hydrophobic polymeric precursors were completely soluble in ethanol, there was no preferential alignment of the microstructures in the ethanol. But the hydrophilic portion of each microstructure was found to swell to a greater extent in ethanol, leading to a slight distortion in the original shape. When dry, the hydrophilic portion of each microstructure was found to shrink in comparison to the hydrophobic phase.

Figure 14:
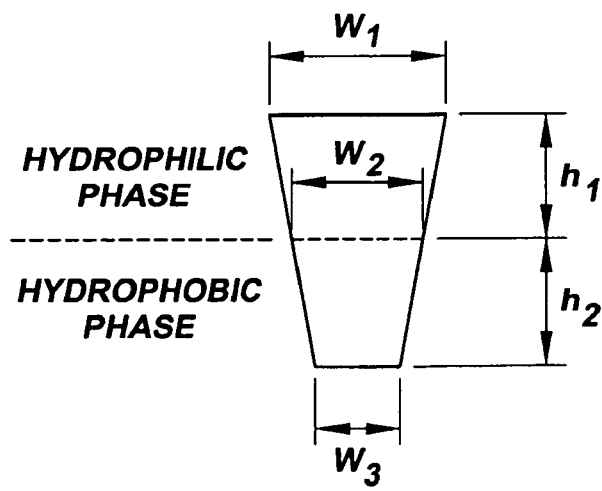
FIG. 14 is a schematic view of an amphiphilic polymeric microstructure, synthesized by the flow structure of FIG. 13, here defining geometric parameters of the microstructure.
Figure 15A:
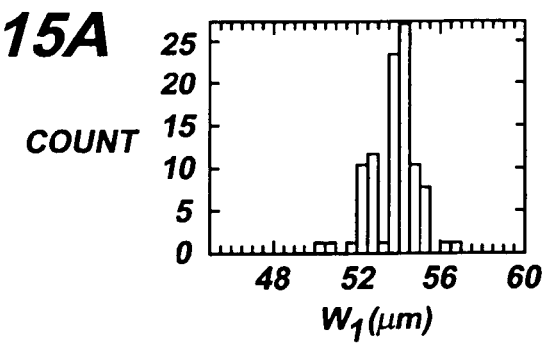
FIGS. 15A-15E are plots of polymeric microstructures counted as a function of measurement for each of the geometric parameters defined in FIG. 14.
Figure 15B:
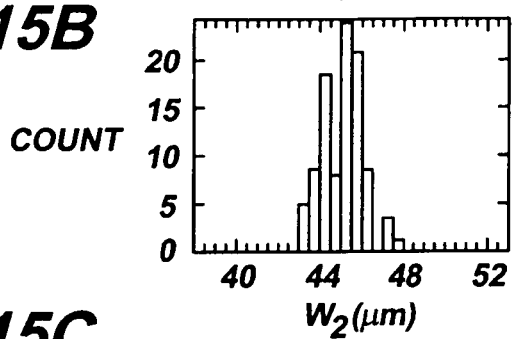
Figure 15C:
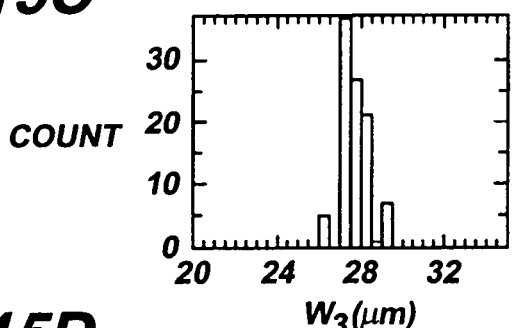
Figure 15D:
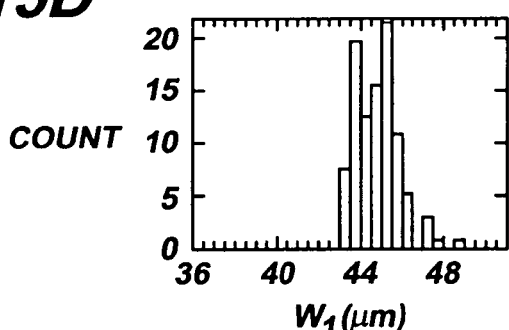
Figure 15E:
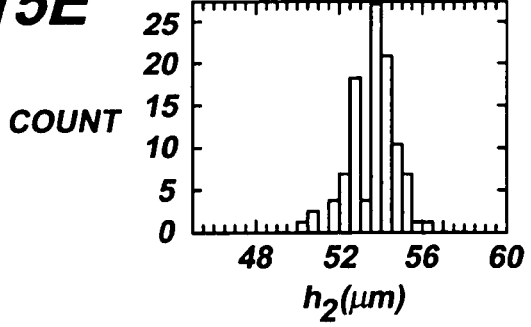

The sizes of the synthesized microstructures were estimated as they were being formed by capturing images of the flowing microstructures a low camera exposure time of 1/10000 s. Statistics were estimated on a 100 consecutive microstructures formed at an exposure time of 0.03 s. A comprehensive analysis of particle monodispersity was performed by measuring the distribution of the five different length variables of the microstructure wedge shape, $w_1$, $w_2$, $w_3$, $h_1$ and $h_2$ as given in FIG. 14. In addition to the mask-defined edges of the microstructures, $w_1$, $w_3$, and ($h_1+h_2$), the lengths of their hydrophilic portion, $h_1$ and hydrophobic portion $h_2$ are recognized to be dictated by the precise position of the interface when polymerization occurs. These lengths were all measured as the microstructure formed in the microfluidic device.

FIGS. 15A-15E are histogram plots of the measured distributions of these dimensions. In all five dimensions that were measured, the coefficient of variation (COV) in size was less than 2.5% so that the particles can be correctly classified as monodisperse, wherein >90% of the distribution was within 5% of the median microstructure size. It was further found that by changing the length of the hydrophilic portion $h_1$ and the hydrophobic portion, $h_2$, the extent of a microstructure's amphiphilicity could also be tightly controlled. The thickness of the particles, in the y direction in FIG. 14, was measured to be 25 µm, which corresponds to an unpolymerized lubrication layer of thickness 2.5 µm at the top and bottom microfluidic device walls, as in the examples above.

Figure 16:
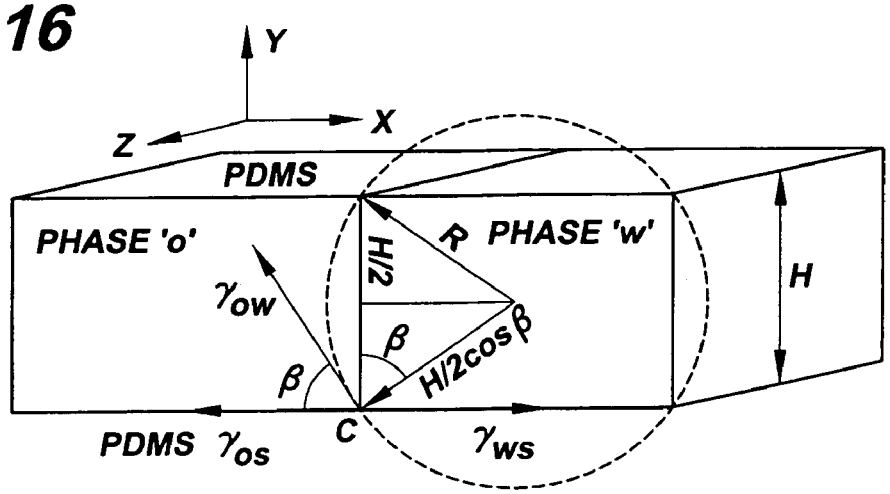
FIG. 16 is a schematic perspective view of an amphiphilic polymeric microstructure, synthesized by the flow structure of FIG. 13, here defining geometric parameters that set the radius of curvature of the interface between a hydrophobic phase and a hydrophilic phase of the microstructure.

An inspection of the cross section of one of the wedge microstructures indicated that the interface between the hydrophilic portion and the hydrophobic portion of the microstructure was characterized by a finite curvature, as in FIG. 10F, and here defined in FIG. 16. This curvature was caused by the immiscibility of the two flowing monomer streams, leading to a sharp, curved interface The hydrophobic ('o') phase preferentially wet the PDMS over the hydrophilic ('w') phase. The contact angle at the interface between the two phases and the PDMS wall, β, was dictated by the interfacial tension between the hydrophilic phase and the hydrophobic phase as well as by the solid-liquid interfacial tension between the PDMS and the two phases.

Using simple geometry, the radius of curvature, R, at the interface can be given as R=H/2 cos β, where H is the height of the microfluidic device cross section. For the experimental parameters given above, a predicted radius of 17.4 μm was determined this was found to match well with the experimentally determined value of 16±1.5 μm. This demonstrates that the interfacial properties of the two monomer streams can be used to tune the curvature of the interface between the two microstructure sections.

The extent of cross-linking of the particles in the two different phases was characterized by measuring the percentage of double bonds converted using FTIR spectroscopy performed on a Nikolet spectrometer, from Thermo Electron Corp., Waltham, Mass., by measuring the decrease in terminal C=C stretch at 1635 cm$^{-1}$ in a thin film of cross-linked polymer. To perform FTIR, individual samples of either the hydrophilic or the hydrophobic monomer were prepared by loading the respective oligomer into a channel with the same dimensions as the microfluidic device used and then given exposure doses of 0.03 s, as with the synthesized microstructures, and 120 s, for fully cross-linked. Strips of polymer film were formed that were used for FTIR measurements. Contact angle and surface tension measurements were performed using a DSA 10 tensiometer, from Druss USA, Matthews, N.C.

Figure 17A:
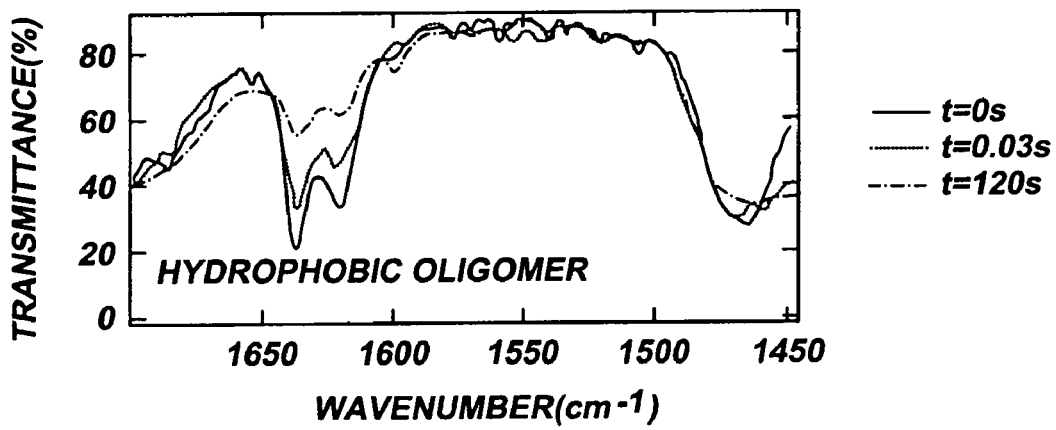
FIGS. 17A-17B are FTIR plots of transmittance as a function of wavenumber for three illumination exposure times and for a hydrophobic oligomer and a hydrophilic oligomer, respectively.
Figure 17B:
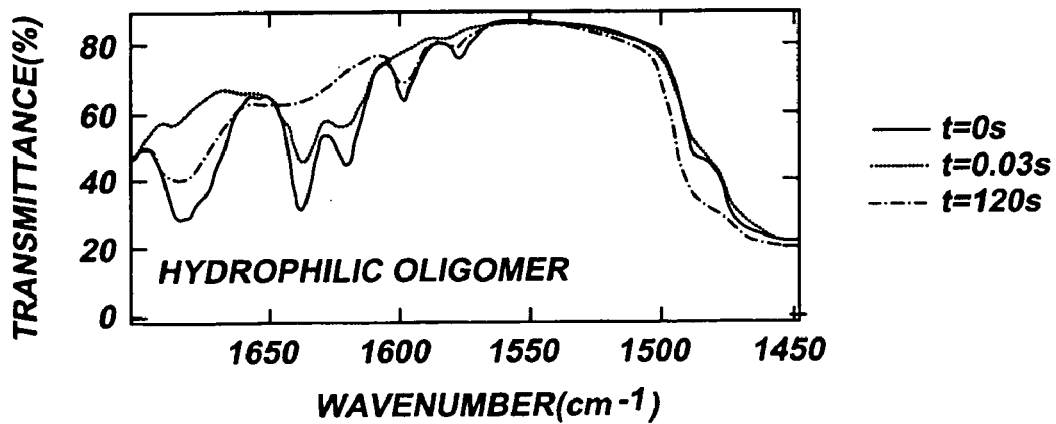

FIG. 17A is a plot of the FTIR spectrum for the hydrophobic monomer stream and FIG. 17B is a plot of the FTIR spectrum for the hydrophilic monomer stream, both for exposure times of 0 s, 0.03 s, and 120 s. In the 0.03 s duration of exposure to UV light, the conversion of double bonds was found to be 47% in the hydrophilic phase and 35% in the hydrophobic phase. Because the conversion of double bonds required to cross-link multifunctional acrylates successfully is typically less than 5%, it is concluded that this exposure dose is sufficient to cross-link the microstructures.

Like amphiphilic molecules, microstructures possessing both hydrophilic and hydrophobic sections exhibit a tendency to orient themselves in order to minimize their surface energy. While thermal energy alone is insufficient to enable these microstructure to explore their energy landscape, external energy provided by, e.g., agitation was employed to aid the microstructures to find their energy minima and self-assemble. The wedge-shaped amphiphilic microstructures were isolated and induced, using agitation, to assemble either in a pure aqueous phase or at the interface of w/o or o/w emulsions. The results showed that the particles have a strong tendency to orient themselves in order to minimize their surface energy.

This method of immiscible microstructure synthesis is of sufficient generality to enable synthesis of a wide range of non-spherical particles with such chemical anisotropy; e.g., amphiphilic particles with a rod-like hydrophobic tail and a disk-shaped hydrophilic head can be synthesized. Such a library of particles can be useful when studying the effect of geometry and chemical anisotropy on meso-scale self assembly and rheology. In addition, structures with more complicated motifs like w-o-w can also be formed quite easily.

With these examples and the description above, it is demonstrated that the invention provides lithographic-based microfluidic methodology that can be employed to continuously or near-continuously synthesize polymeric microstructures of varied complex shapes, chemistries, and functionalities with an elegant dual lithography-polymerization step. The morphology and chemistry of the microstructures that are synthesized can be independently controlled to produce large numbers of uniquely shaped, functionalized polymeric microstructures for applications including drug delivery, biosensing, microactuation, and fundamental studies on self-assembly and rheology, among others. The high-through-put of the synthesis processes of the invention enables the practical achievement of polymeric microstructure synthesis on a scale that is required for many of these applications.

It is recognized, of course, that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

We claim:

1. A method for synthesizing polymeric microstructures comprising:
   flowing a monomer stream, at a selected flow rate, through a fluidic channel;
   projecting at least one shaped pulse of illumination to the monomer stream, defining in the monomer stream a shape of at least one microstructure corresponding to the illumination pulse shape while polymerizing that microstructure shape in the monomer stream by the illumination pulse; and
   providing a polymerization termination species at internal walls of the fluidic channel to terminate at the channel walls active polymerization sites at which polymerization could occur during polymerization of a microstructure, such that polymerization is quenched at those sites and a non-polymerized volume of the monomer stream is preserved adjacent to the channel walls.

2. The method of claim 1 wherein the illumination pulse comprises UV illumination.

3. The method of claim 1 wherein the illumination pulse comprises visible illumination.

4. The method of claim 1 wherein the illumination pulse comprises IR illumination.

5. The method of claim 1 wherein the illumination pulse comprises a sequence of illumination pulses.

6. The method of claim 1 wherein the illumination pulse is characterized by a duration that is sufficient to polymerize the microstructure.

7. The method of claim 1 wherein the illumination pulse is characterized by a duration that is sufficient to polymerize a selected microstructure length.

8. The method of claim 1 wherein the illumination pulse polymerizes the microstructure by photo-polymerization.

9. The method of claim 1 wherein the illumination pulse polymerizes the microstructure by thermal polymerization.

10. The method of claim 1 wherein the illumination pulse polymerizes the microstructure by free-radical-initiated polymerization.

11. The method of claim 1 further comprising shuttering illumination to form illumination pulses for projection to the monomer stream.

12. The method of claim 1 further comprising shaping the illumination pulse by projecting the pulse through a mask prior to projection of the pulse to the monomer stream.

13. The method of claim 12 wherein the mask includes a plurality of microstructure shapes.

14. The method of claim 13 wherein the plurality of microstructure shapes of the mask are substantially identical.

15. The method of claim 13 wherein at least two of the microstructure shapes of the mask are distinct.

16. The method of claim 12 wherein the mask comprises a lithographic mask.

17. The method of claim 12 wherein the mask comprises a transparency mask.

18. The method of claim 12 wherein the mask comprises a chrome mask.

19. The method of claim 12 wherein the mask comprises a gray-scale mask.

20. The method of claim 1 wherein projecting the shaped pulse of illumination comprises controlling illumination shape by a digital micromirror device.

21. The method of claim 1 wherein projecting the shaped pulse of illumination comprises dynamically changing pulse shape during illumination.

22. The method of claim 1 wherein projecting the shaped pulse of illumination comprises directing a plurality of illumination beams to the monomer stream in a beam configuration corresponding to a selected microstructure shape.

23. The method of claim 22 wherein the illumination beams comprises laser beams.

24. The method of claim 1 further comprising projecting the shaped pulse of illumination through a lens for adjustment of shape magnification prior to projection to the monomer stream.

25. The method of claim 24 wherein the lens comprises an inverted microscope objective.

26. The method of claim 1 wherein the fluidic channel comprises a hollow cross section of a polymeric fluidic device.

27. The method of claim 26 wherein the fluidic channel cross section is rectangular.

28. The method of claim 26 wherein the fluidic channel cross section is non-rectangular.

29. The method of claim 26 wherein the fluidic channel cross section is circular.

30. The method of claim 26 wherein the fluidic channel cross section is stepped.

31. The method of claim 26 wherein the fluidic channel cross section is angled.

32. The method of claim 1 wherein the monomer stream includes a photo-polymerizable monomer.

33. The method of claim 32 wherein the monomer stream further includes a photoinitiator species.

34. The method of claim 32 wherein the photo-polymerizable monomer comprises poly(ethylene glycol) diacrylate.

35. The method of claim 33 wherein the photoinitiator species comprises 2-hydroxy-2-methyl-1-phenyl-propan-1-one.

36. The method of claim 1 wherein the monomer stream comprises a continuous-liquid-phase stream.

37. The method of claim 1 wherein the monomer stream flow is continuous.

38. The method of claim 1 wherein the monomer stream flow is substantially stopped during pulse illumination projection to the monomer stream.

39. The method of claim 1 wherein the illumination pulse comprises a sequence of pulses that are controlled in coordination with monomer stream flow rate to polymerize a microstructure chain in which microstructures are linked to the chain by an overlapping polymerized region.

40. The method of claim 39 wherein the microstructure chain comprises a plurality of microstructure shapes.

41. The method of claim 1 wherein the monomer stream comprises a plurality of co-flowing monomer streams together flowing through the fluidic channel, each co-flowing monomer stream including a distinct stream species.

42. The method of claim 41 wherein the distinct stream species comprise porogen species.

43. The method of claim 41 wherein the distinct stream species comprise moiety species.

44. The method of claim 41 wherein the distinct stream species comprise particle species.

45. The method of claim 41 wherein projection of a shaped pulse of illumination comprises directing a shaped pulse of illumination to include a plurality of the co-flowing monomer streams to polymerize at least one microstructure including monomer from the plurality of co-flowing monomer streams.

46. The method of claim 41 wherein two adjacent co-flowing streams are miscible.

47. The method of claim 41 wherein two adjacent co-flowing streams are immiscible.

48. The method of claim 41 wherein a first co-flowing monomer stream is hydrophobic and a co-flowing monomer stream adjacent to the first is hydrophilic.

49. The method of claim 41 wherein the flow rate of each co-flowing monomer stream is separately controlled to control proportions of monomers from the co-flowing monomer streams to be polymerized in a microstructure.

50. The method of claim 1 wherein the non-polymerized volume of monomer stream forms a lubricating layer and a stream in which polymerized microstructures can be transported through the channel.

51. The method of claim 1 wherein the microstructure polymerization is free-radical polymerization and the termination species terminates free-radicals.

52. The method of claim 51 wherein the termination species is oxygen.

53. The method of claim 1 wherein the microstructure polymerization is non-free-radical polymerization.

54. The method of claim 53 wherein the termination species is a base.

55. The method of claim 1 wherein the termination species is provided by diffusion of the species through the fluidic channel walls.

56. The method of claim 1 wherein the monomer stream includes at least one moiety that is covalently incorporated into the microstructure by the microstructure polymerization.

57. The method of claim 56 wherein the moiety comprises a monomer.

58. The method of claim 57 wherein the monomer comprises a temperature-sensitive monomer.

59. The method of claim 57 wherein the monomer comprises a pH-sensitive monomer.

60. The method of claim 57 wherein the monomer comprises a photo-sensitive monomer.

61. The method of claim 57 wherein the monomer comprises an antigen-responsive monomer.

62. The method of claim 57 wherein the monomer comprises a biodegradable monomer.

63. The method of claim 1 wherein the monomer stream includes biological material.

64. The method of claim 63 wherein the biological material comprises DNA.

65. The method of claim 63 wherein the biological material comprises RNA.

66. The method of claim 63 wherein the biological material comprises a polypeptide.

67. The method of claim 63 wherein the biological material comprises an enzyme.

68. The method of claim 63 wherein the biological material comprises an antibody.

69. The method of claim 63 wherein the biological material comprises at least a portion of a cell.

70. The method of claim 63 wherein the biological material comprises mitochondria.

71. The method of claim 1 wherein the monomer stream includes a fluorophore.

72. The method of claim 1 wherein the monomer stream includes a chromophore.

73. The method of claim 1 wherein the monomer stream includes a moiety that forms a dispersed phase which is physically entrapped in the microstructure by the microstructure polymerization.

74. The method of claim 1 wherein the monomer stream includes a porogen.

75. The method of claim 1 wherein the monomer stream includes particles.

76. The method of claim 1 wherein the monomer stream includes quantum dots.

77. The method of claim 1 wherein the monomer stream includes carbon nanotubes.

78. The method of claim 1 wherein the monomer stream includes emulsified liquid droplets.

79. The method of claim 1 wherein the monomer stream includes gas bubbles.

80. The method of claim 1 wherein the monomer stream includes electrically conducting particles.

81. The method of claim 1 wherein the monomer stream includes magnetizable particles.

82. The method of claim 1 wherein the monomer stream includes three-dimensional microfabricated structures.

83. The method of claim 1 wherein the monomer stream includes a virus.

84. The method of claim 1 wherein the polymerized microstructure in the monomer stream includes three-dimensional features.

85. The method of claim 1 wherein the polymerized microstructure in the monomer stream comprises a polymeric non-spheroidal microstructure.

86. The method of claim 1 wherein the polymerized microstructure in the monomer stream comprises a planar polymeric microstructure.

87. The method of claim 1 wherein the polymerized microstructure in the monomer stream comprises at least one straight edge.

88. The method of claim 87 wherein the polymerized microstructure in the monomer stream comprises a plurality of straight edges.

89. The method of claim 1 wherein the polymerized microstructure in the monomer stream comprises at least one rounded feature.

90. The method of claim 1 wherein the polymerized microstructure in the monomer stream comprises a polymeric microstructure that is hollow.

91. The method of claim 1 wherein the polymerized microstructure in the monomer stream comprises a polymeric microstructure that is cylindrical.

92. The method of claim 1 wherein the polymerized microstructure in the monomer stream comprises a polymeric microstructure that is non-continuous across a plane of the microstructure.

93. The method of claim 92 wherein apertures in the microstructure result in the non-continuity of the microstructure.

94. The method of claim 93 wherein at least one aperture is straight-edged.

95. The method of claim 93 wherein at least one aperture is rounded.

96. The method of claim 45 wherein the polymerized microstructure including the co-flowing monomer streams comprises at least two regions each of a distinct polymeric composition.

97. The method of claim 45 wherein the polymerized microstructure including the co-flowing monomer streams comprises at least one region including a porogen.

98. The method of claim 45 wherein the polymerized microstructure including the co-flowing monomer streams comprises at least one region including a covalently bonded moiety.

99. The method of claim 45 wherein the polymerized microstructure including the co-flowing monomer streams comprises at least one hydrophobic region and at least one hydrophilic region.

100. A method for synthesizing polymeric microstructures comprising:
flowing a monomer stream, at a selected flow rate, through a fluidic channel;
projecting illumination to the monomer stream to polymerize at least one microstructure in the monomer stream by the illumination; and
providing at least one polymerization termination species, at internal walls of the fluidic channel, which terminates at the channel walls active polymerization sites at which polymerization could occur during polymerization of the microstructure, quenching polymerization at those sites and preserving a non-polymerized volume of the monomer stream adjacent to the channel walls.

101. The method of claim 100 wherein the non-polymerized volume of monomer stream forms a lubricating layer and a stream in which polymerized microstructures can be transported through the channel.

102. The method of claim 100 wherein the microstructure polymerization is free-radical polymerization and the termination species terminates free-radicals.

103. The method of claim 102 wherein the termination species is oxygen.

104. The method of claim 100 wherein the microstructure polymerization is non-free-radical polymerization.

105. The method of claim 104 wherein the termination species is a base.

106. The method of claim 100 wherein the termination species is diffused through the fluidic channel walls.

107. The method of claim 106 wherein the termination species is a gaseous diffusion species.

108. The method of claim 106 wherein the termination species is a liquid diffusion species.

109. A method for synthesizing polymeric microstructures comprising:
flowing a monomer stream, at a selected flow rate, through a fluidic channel; and
projecting to the monomer stream a sequence of shaped illumination pulses that are controlled in coordination with monomer stream flow rate, defining in the monomer stream a microstructure chain in which microstructures corresponding to the illumination pulse shape are linked to the chain by an overlapping polymerized region, while polymerizing the chain of microstructure shapes in the monomer stream by the illumination pulse.

110. The method of claim 109 wherein the microstructure chain comprises a plurality of microstructure shapes.

111. A method for synthesizing polymeric microstructures comprising:
flowing a plurality of co-flowing monomer streams together through a fluidic channel at a selected flow rate, each co-flowing monomer stream including a distinct stream species; and
projecting at least one shaped pulse of illumination to the monomer streams, defining in the monomer streams a shape of at least one microstructure corresponding to the illumination pulse shape while polymerizing that microstructure shape in the monomer streams by the illumination pulse.

112. The method of claim 111 wherein the distinct stream species comprise porogen species.

113. The method of claim 111 wherein the distinct stream species comprise moiety species.

114. The method of claim 111 wherein the distinct stream species comprise particle species.

115. The method of claim 111 wherein projection of a shaped pulse of illumination comprises directing a shaped pulse of illumination to include a plurality of the co-flowing monomer streams to polymerize at least one microstructure including monomer from the plurality of co-flowing monomer streams.

116. The method of claim 111 wherein two adjacent co-flowing streams are miscible.

117. The method of claim 111 wherein two adjacent co-flowing streams are immiscible.

118. The method of claim 111 wherein a first co-flowing monomer stream is hydrophobic and a co-flowing monomer stream adjacent to the first is hydrophilic.

119. The method of claim 111 wherein the flow rate of each co-flowing monomer stream is separately controlled to control proportions of monomers from the co-flowing monomer streams to be polymerized in a microstructure.

120. The method of claim 115 wherein the polymerized microstructure including the co-flowing monomer streams comprises at least two regions each of a distinct polymeric composition.

121. The method of claim 115 wherein the polymerized microstructure including the co-flowing monomer streams comprises at least one region including a porogen.

122. The method of claim 115 wherein the polymerized microstructure including the co-flowing monomer streams comprises at least one region including a covalently bonded moiety.

123. The method of claim 115 wherein the polymerized microstructure including the co-flowing monomer streams comprises at least one hydrophobic region and at least one hydrophilic region.

124. The method of claim 111 further comprising providing a polymerization termination species at internal walls of the fluidic channel to terminate at the channel walls active polymerization sites at which polymerization could occur during polymerization of a microstructure, such that polymerization is quenched at those sites and a non-polymerized volume of the monomer stream is preserved adjacent to the channel walls.

125. A method for synthesizing polymeric microstructures comprising:
continuously flowing a monomer stream, at a selected flow rate, through a fluidic channel; and
projecting at least one shaped pulse of illumination to the monomer stream as the stream continuously flows, defining in the monomer stream a shape of at least one microstructure corresponding to the illumination pulse shape while polymerizing that microstructure shape in the monomer stream by the illumination pulse.

126. The method of claim 125 wherein the illumination pulse comprises UV illumination.

127. The method of claim 125 wherein the fluidic channel cross section is non-rectangular.

128. The method of claim 125 wherein the monomer stream includes a photo-polymerizable monomer.

129. The method of claim 128 wherein the monomer stream further includes a photoinitiator species.

130. The method of claim 128 wherein the photo-polymerizable monomer comprises poly(ethylene glycol) diacrylate.

131. The method of claim 129 wherein the photoinitiator species comprises 2-hydroxy-2-methyl-1-phenyl-propan-1-one.

132. The method of claim 125 wherein the monomer stream comprises a plurality of co-flowing monomer streams together flowing through the fluidic channel, each co-flowing monomer stream including a distinct stream species.

133. The method of claim 125 further comprising providing a polymerization termination species at internal walls of the fluidic channel to terminate at the channel walls active polymerization sites at which polymerization could occur during polymerization of a microstructure, such that polymerization is quenched at those sites and a non-polymerized volume of the monomer stream is preserved adjacent to the channel walls.

* * * * *